US009143032B2

(12) United States Patent
Le et al.

(10) Patent No.: US 9,143,032 B2
(45) Date of Patent: Sep. 22, 2015

(54) APPARATUS, SYSTEMS, AND METHODS FOR PROVIDING A HYBRID POWER REGULATOR

(71) Applicant: Lion Semiconductor Inc., Berkeley, CA (US)

(72) Inventors: Hanh-Phuc Le, Richmond, CA (US); John Crossley, Oakland, CA (US); Wonyoung Kim, Berkeley, CA (US)

(73) Assignee: LION SEMICONDUCTOR INC., Berkeley, CA (US)

( * ) Notice: Subject to any disclaimer, the term of this patent is extended or adjusted under 35 U.S.C. 154(b) by 47 days.

(21) Appl. No.: 14/250,970

(22) Filed: Apr. 11, 2014

(65) Prior Publication Data
US 2014/0306673 A1    Oct. 16, 2014

Related U.S. Application Data

(60) Provisional application No. 61/810,998, filed on Apr. 11, 2013.

(51) Int. Cl.
*G05F 1/00* (2006.01)
*H02M 3/04* (2006.01)
(Continued)

(52) U.S. Cl.
CPC .............. *H02M 3/04* (2013.01); *H02J 7/0052* (2013.01); *H02M 3/07* (2013.01); *H02M 3/156* (2013.01);
(Continued)

(58) Field of Classification Search
CPC ..................... H02M 2001/0025; H02M 3/156; H02M 1/36; H02M 3/07; H02M 3/1582
USPC ........................ 323/265–266, 271–272, 282
See application file for complete search history.

(56) References Cited

U.S. PATENT DOCUMENTS 5,959,853 A * 9/1999 Kos .................................. 363/59
6,055,168 A * 4/2000 Kotowski et al. ............... 363/60
(Continued)

FOREIGN PATENT DOCUMENTS

WO    WO-2010130588 A2    11/2010
WO    WO-2012151466 A2    11/2012

OTHER PUBLICATIONS

International Search Report and Written Opinion Issued by the European Patent Office as International Searching Authority for International Application No. PCT/US2014/033759 mailed Feb. 4, 2015 (18 pgs.).

(Continued)

*Primary Examiner* — Adolf Berhane
*Assistant Examiner* — Henry Lee, III
(74) *Attorney, Agent, or Firm* — Wilmer Cutler Pickering Hale and Dorr LLP

(57) ABSTRACT

The present disclosure shows a hybrid regulator topology that can be more easily integrated and that can maintain high efficiency across a wide output and input voltage range, even with a small inductor. The hybrid regulator topology can include two types of regulators: a flying switched-inductor regulator and a step-down regulator that divides the input voltage into an M/N fraction of the input voltage. The disclosed embodiments of the hybrid regulator topology can reduce the capacitive loss of the flying switched-inductor regulator by limiting the voltage swing across the switches in the flying switched-inductor regulator. The disclosed embodiments of the hybrid regulator topology can reduce the inductor resistive loss of the flying switched-inductor regulator by operating the flying switched-inductor regulator at a high switching frequency and with a small amount of current flow through the inductor.

22 Claims, 32 Drawing Sheets

(51) Int. Cl.
  *H02J 7/00*    (2006.01)
  *H02M 3/156*   (2006.01)
  *H02M 3/07*    (2006.01)
  *H02M 3/158*   (2006.01)
  *G05F 1/613*   (2006.01)
  *H02M 1/00*    (2007.01)

(52) U.S. Cl.
  CPC ........ *H02M 3/158* (2013.01); *H02J 2007/0062* (2013.01); *H02M 2001/007* (2013.01); *H02M 2001/0093* (2013.01); *H02M 2003/072* (2013.01)

(56) References Cited

U.S. PATENT DOCUMENTS

| 6,169,392 | B1* | 1/2001  | Kitagawa ..................... 323/282 |
| 6,317,343 | B1* | 11/2001 | Okamura et al. .............. 363/59 |
| 7,990,741 | B2* | 8/2011  | Martinussen .................. 363/60 |
| 2003/0007373 | A1* | 1/2003 | Satoh ............................. 363/60 |
| 2007/0052471 | A1* | 3/2007 | Ng ................................. 327/536 |
| 2007/0139982 | A1* | 6/2007 | Ueno et al. ..................... 363/59 |
| 2008/0157732 | A1 | 7/2008 | Williams |
| 2009/0206804 | A1 | 8/2009 | Xu et al. |
| 2011/0221482 | A1 | 9/2011 | Kim et al. |

OTHER PUBLICATIONS

Kim et al., "A Fully-Integrated 3-Level DC-DC Converter for Nanosecond-Scale DVFS," IEEE Journal of Solid-State Circuits, vol. 47, No. 1, Jan. 2012 (pp. 206-219).

Kim et al., "System Level Analysis of Fast, Per-Core DVFS Using On-Chip Switching Regulators," IEEE International Symposium of High-Performance Computer Architecture (HPCA), Feb. 2008 (12 pgs.).

Le et al., "Design Techniques for Fully Integrated Switched-Capacitor DC-DC Converters," IEEE Journal of Solid-State Circuits, vol. 46, No. 9, Sep. 2011 (pp. 2120-2131).

* cited by examiner

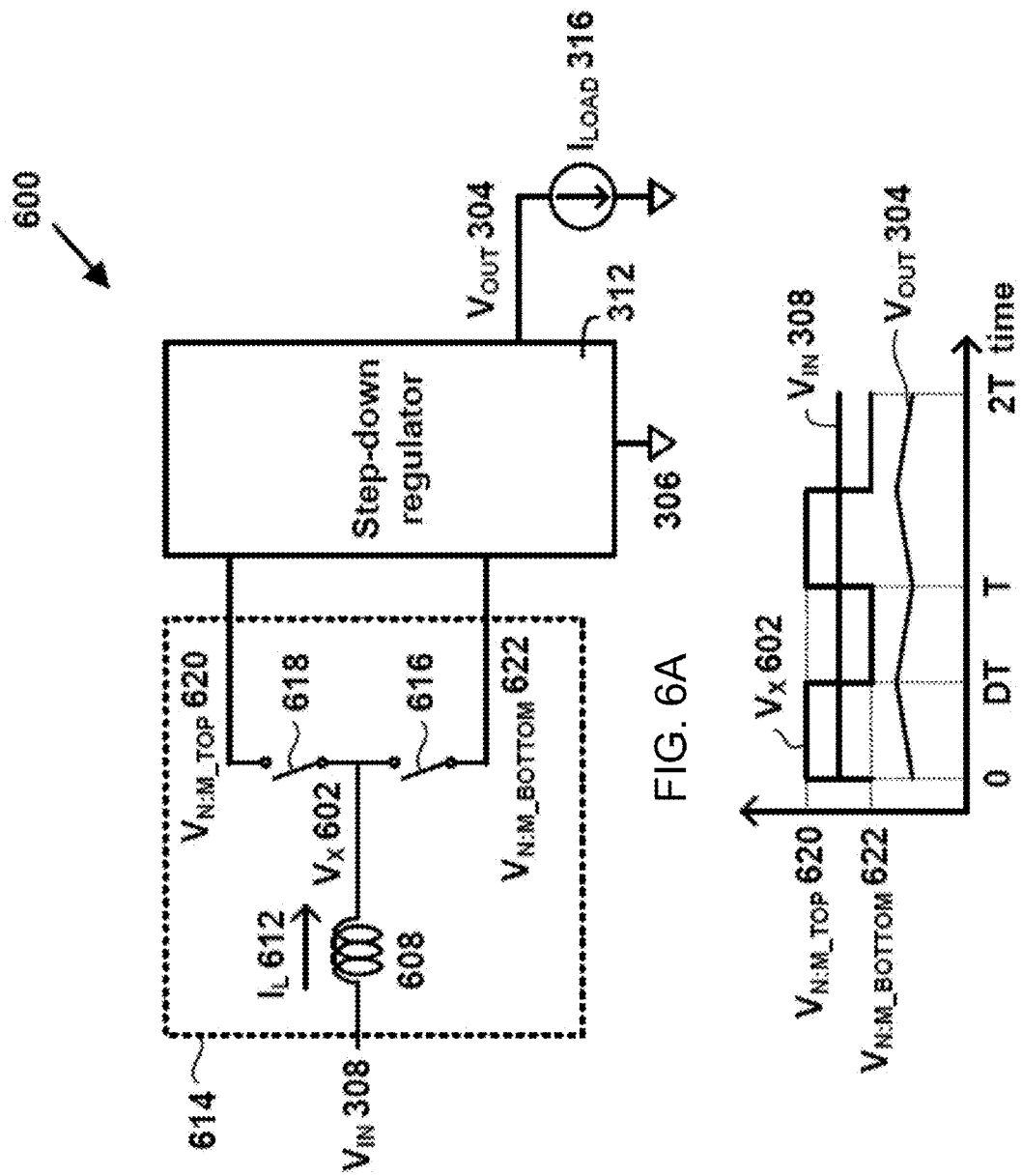

APPARATUS, SYSTEMS, AND METHODS FOR PROVIDING A HYBRID POWER REGULATOR

CROSS REFERENCE TO RELATED APPLICATIONS

This application claims benefit of the earlier filing date, under 35 U.S.C. §119(e), of U.S. Provisional Application No. 61/810,998, filed on Apr. 11, 2013, entitled "SYSTEMS AND METHODS FOR PROVIDING A HYBRID VOLTAGE REGULATOR", which is herein incorporated by reference in its entirety.

STATEMENT REGARDING FEDERALLY SPONSORED RESEARCH OR DEVELOPMENT

This invention was made with government support under 1248828 awarded by the National Science Foundation (NSF). The government has certain rights in the invention.

TECHNICAL FIELD

The present disclosure relates to apparatus, systems, and methods for providing a hybrid power regulator.

BACKGROUND

There is a strong demand to reduce the size of electronic systems. The size reduction is especially desirable in mobile electronics where space is a premium, but is also desirable in servers that are placed in big data centers since it is important to squeeze in as many servers as possible in a fixed real estate.

One of the largest components in electronic systems includes voltage regulators (sometimes also referred to as power regulators). A voltage (or power) regulator is designed to convert a source voltage of a source voltage signal to a target voltage so that the target voltage can serve an output load of the voltage/power regulator. Power regulators often include a large number of bulky off-chip components to deliver voltages to integrated chips, including processors, memory devices (e.g., a dynamic read access memory (DRAM)), radio-frequency (RF) chips, WiFi combo chips, and power amplifiers. Therefore, it is desirable to reduce the size of the voltage regulators in electronic systems.

Power regulators include semiconductor chips, such as a DC-DC regulator chip, that deliver power from a power source (e.g., a battery) to an output load. The output load can include a variety of integrated chips (e.g., an application processor, a DRAM, a NAND flash memory) in an electronic device. To efficiently deliver power, a voltage regulator can use a "buck" topology. Such a regulator is referred to as a buck regulator. A buck regulator transfers charges from the power source to the output load using an inductor. A buck regulator can use power switches to connect/disconnect the inductor to one of multiple voltages, thereby providing an output voltage that is a weighted average of the multiple voltages. A buck regulator can adjust the output voltage by controlling the amount of time the inductor is coupled to one of the multiple voltages.

Unfortunately, a buck regulator is not suitable for highly integrated electronic systems. The conversion efficiency of a buck regulator depends on the size of the inductor, in particular when the power conversion ratio is high and when the amount of current consumed by the output load is high. Because an inductor can occupy a large area and is bulky to integrate on-die or on-package, existing buck regulators often use a large number of off-chip inductor components. This strategy often requires a large area on the printed circuit board, which in turn increases the size of the electronic device. The challenge is exacerbated as mobile system-on-chips (SoCs) become more complex and need increasingly larger number of voltage domains to be delivered by the voltage regulator.

SUMMARY

Some embodiments of the disclosed subject matter include a voltage regulator. The voltage regulator is configured to receive a first voltage signal and provide a final voltage signal based, at least in part, on the first voltage signal. The voltage regulator includes a flying switched-inductor regulator having a first input terminal configured to receive a first voltage signal, a second input terminal configured to receive a second voltage signal, and an output terminal configured to provide an intermediate voltage signal based, at least in part, on the first voltage signal and the second voltage signal; a step-down regulator comprising an input terminal, coupled to the output terminal of the flying switched-inductor regulator, an output terminal, and a plurality of capacitors, wherein the step-down regulator is configured to receive, at the input terminal of the step-down regulator, the intermediate voltage signal from the output terminal of the flying switched-inductor regulator and provide, to the output terminal of the step-down regulator, the final voltage signal using a predetermined configuration of the plurality of capacitors; and a level shifting regulator comprising an input terminal, an output terminal, a flying capacitor, and a plurality of switches, wherein the level shifting regulator is configured to receive, at the input terminal of the level shifting regulator, the final voltage signal of the step-down regulator and to provide, at the output terminal of the level shifting regulator, the second voltage signal that is based on the final voltage signal of the step-down regulator.

In some embodiments of the voltage regulator disclosed herein, the level shifting regulator can be configured to change a configuration of the plurality of switches to provide the flying capacitor in parallel with the first input terminal and the second input terminal of the flying switched-inductor regulator.

In some embodiments of the voltage regulator disclosed herein, the level shifting regulator can be configured to change a configuration of the plurality of switches to provide the flying capacitor in parallel with the output terminal of the step-down regulator and ground.

In some embodiments of the voltage regulator disclosed herein, the flying switched-inductor regulator can include an inductor having an inductance within a range of 100 pico-Henry and 1 micro-Henry.

In some embodiments of the voltage regulator disclosed herein, at least one of the plurality of capacitors in the step-down regulator can be fabricated using a dynamic random access memory (DRAM) fabrication process.

In some embodiments of the voltage regulator disclosed herein, the flying switched-inductor regulator can include a plurality of regulators configured to operate in parallel in a time interleaved manner.

In some embodiments of the voltage regulator disclosed herein, the flying switched-inductor regulator can be configured to operate at a first switching frequency, and the step-down regulator can be configured to operate at a second switching frequency.

In some embodiments of the voltage regulator disclosed herein, the voltage regulator can also include a first control loop configured to regulate the final voltage signal of the step-down regulator, and a second control loop configured to regulate the intermediate voltage signal of the flying switched-inductor regulator.

In some embodiments of the voltage regulator disclosed herein, the first control loop can be configured to operate the step-down regulator to provide a fraction of the intermediate voltage signal at the output node so that the step-down regulator operates in a configuration providing a high conversion efficiency.

In some embodiments of the voltage regulator disclosed herein, the first control loop can be configured to operate the step-down regulator to cause the final voltage signal of the step-down regulator to be within a predetermined error range of a target output voltage.

In some embodiments of the voltage regulator disclosed herein, the flying switched-inductor regulator and the step-down regulator, excluding the inductor of the flying switched-inductor regulator, can be provided in a single die.

In some embodiments of the voltage regulator disclosed herein, the inductor can be provided as a discrete component on-package or on-board.

Some embodiments of the disclosed subject matter include an electronic system. The electronic system can include some embodiments of the voltage regulator disclosed herein. The electronic system can also include a target load system coupled to the voltage regulator, wherein the output terminal of the step-down regulator in the voltage regulator is coupled to the target load system.

In some embodiments of the electronic system disclosed herein, the target load system can include a battery and the voltage regulator can be configured to receive the first voltage signal from a power line of a Universal Serial Bus and to provide the final voltage signal to the battery.

In some embodiments of the electronic system disclosed herein, the target load system can include a System on Chip (SoC), and the SoC and the voltage regulator can be packaged in a single SoC package.

In some embodiments of the electronic system disclosed herein, the target load system can include a System on Chip (SoC), and the SoC and the voltage regulator can be provided on a printed circuit board (PCB).

Some embodiments of the disclosed subject matter include an electronic system. The electronic system can include an embodiment of a voltage regulator disclosed herein, wherein the voltage regulator is configured to operate in a reverse direction in which the output terminal of the step-down regulator in the voltage regulator is coupled to an input voltage source and the first input terminal of the flying switched-inductor regulator is coupled to a target load of the voltage regulator.

In some embodiments of the electronic system disclosed herein, the electronic system operating the voltage regulator in a reverse direction can be configured to operate the voltage regulator as a step-up regulator.

In some embodiments of the electronic system disclosed herein, the output terminal of the step-down regulator can be coupled to a battery and the first input terminal of the flying switched-inductor regulator can be coupled to a power line of a Universal Serial Bus.

Some embodiments of the disclosed subject matter includes a method of converting an first voltage signal to a final voltage signal using a voltage regulator comprising a flying switched-inductor regulator and a step-down regulator. The method can include receiving the first voltage signal at a first input terminal of the flying switched-inductor regulator and a second voltage signal at a second input terminal of the flying switched-inductor regulator; providing, at an output terminal of the flying switched-inductor regulator, an intermediate voltage signal based, at least in part, on the first voltage signal and the second voltage signal; providing, to an output terminal of a step-down regulator using a predetermined configuration of a plurality of capacitors in the step-down regulator, the final voltage signal based on the intermediate voltage signal; and receiving, at an input terminal of a level shifting regulator, the final voltage signal and providing, using the level shift regulator, to the second input terminal of the flying switched-inductor regulator, the second voltage signal determined based on the final voltage signal, forming a feedback path between the output terminal of the step-down regulator and the second input terminal of the flying switched-inductor regulator.

In some embodiments of the method disclosed herein, the level shifting regulator can include a flying capacitor and a plurality of switches, and the method can include providing the flying capacitor in parallel with the first input terminal and the second input terminal of the flying switched-inductor regulator by modifying a configuration of the plurality of switches.

In some embodiments of the method disclosed herein, the level shifting regulator can include a flying capacitor and a plurality of switches, and the method can further include providing the flying capacitor in parallel with the output terminal of the step-down regulator and ground by modifying a configuration of the plurality of switches.

Some embodiments of the disclosed subject matter includes a voltage regulator configured to receive a first voltage signal and provide a second voltage signal based, at least in part, on the first voltage signal. The voltage regulator can include a receiving regulator comprising an inductor, wherein the receiving regulator is configured to receive the first voltage signal at a first terminal of the inductor and to provide an intermediate voltage signal at a second terminal of the inductor based, at least in part, on the first voltage signal; and a step-down regulator comprising a plurality of input terminals and an output terminal, wherein the step-down regulator is configured to receive, at one of the plurality of input terminals, the intermediate voltage signal from the second terminal of the inductor for a portion of a time period, and to provide the second voltage signal at the output terminal based on the received intermediate voltage signal.

In some embodiments of the voltage regulator disclosed herein, the voltage regulator can further include a plurality of switches configured to couple the second terminal of the inductor to at least one of the plurality of input terminals.

In some embodiments of the voltage regulator disclosed herein, a first switch of the plurality of switches is configured to couple the second terminal of the inductor to a first input terminal of the plurality of input terminals, wherein a second switch of the plurality of switches is configured to couple the second terminal of the inductor to a second input terminal of the plurality of input terminals, and the first switch and the second switch are turned on in a time-multiplexed manner.

In some embodiments of the voltage regulator disclosed herein, the step-down regulator is configured to reduce a voltage at the first input terminal by a first amount and reduce a voltage at the second input terminal by a second amount different from the first amount.

In some embodiments of the voltage regulator disclosed herein, the voltage regulator can include a controller configured to control a duty cycle of the first switch and the second switch to control the second voltage signal of the voltage regulator.

In some embodiments of the voltage regulator disclosed herein, the step-down regulator can include a plurality of switched capacitor regulators.

In some embodiments of the voltage regulator disclosed herein, the receiving regulator and the plurality of switches can form a flying switched-inductor regulator.

In some embodiments of the voltage regulator disclosed herein, the step-down regulator and the plurality of switches can form a switched capacitor regulator.

In some embodiments of the voltage regulator disclosed herein, the receiving regulator can include a shunt switch that is configured to short the inductor when the voltage regulator is initially powered up to reduce an inrush current.

In some embodiments of the voltage regulator disclosed herein, the receiving regulator can include a series switch in series with the inductor, wherein the series switch is configured to decouple the inductor from the first switch and the second switch when the voltage regulator is initially powered up to reduce an inrush current.

In some embodiments of the voltage regulator disclosed herein, the voltage regulator can include a shunt regulator configured to increase a voltage at the second terminal of the inductor when the voltage regulator is initially powered up to reduce an inrush current.

In some embodiments of the voltage regulator disclosed herein, the voltage regulator can include a shunt regulator configured to increase a voltage at one of nodes within the step-down regulator when the voltage regulator is initially powered up to reduce an inrush current.

In some embodiments of the voltage regulator disclosed herein, the step-down regulator comprises at least one capacitor, and the at least one capacitor is fabricated using a dynamic random access memory (DRAM) fabrication process.

Some embodiments of the disclosed subject matter include an electronic system. The electronic system includes a voltage regulator in accordance with some embodiments, and a target load system coupled to the voltage regulator, wherein the output terminal of the switched capacitor regulator in the voltage regulator is coupled to the target load system.

In some embodiments of the electronic system disclosed herein, the target load system includes a battery and the voltage regulator is configured to receive the first voltage signal from a power line of a Universal Serial Bus and to provide the second voltage signal to the battery to charge the battery using the power line of the Universal Serial Bus.

Some embodiments of the disclosed subject matter include an electronic system. The electronic system can include a voltage regulator in accordance with some embodiments, where the voltage regulator is configured to operate in a reverse direction in which the output terminal of the switched capacitor regulator in the voltage regulator is coupled to an input voltage source and the first terminal of the inductor in the receiving regulator is coupled to a target load of the voltage regulator.

In some embodiments of the electronic system disclosed herein, the electronic system operating the voltage regulator in a reverse direction is configured to operate the voltage regulator as a step-up regulator.

In some embodiments of the electronic system disclosed herein, the output terminal of the switched capacitor regulator in the voltage regulator is coupled to a battery and the first terminal of the inductor in the receiving regulator is coupled to a power line of a Universal Serial Bus.

Some embodiments of the disclosed subject matter includes a method of converting an first voltage signal to a second voltage signal using a voltage regulator comprising a receiving regulator and a switched capacitor regulator. The method can include receiving, at a first terminal of an inductor in the receiving regulator, the first voltage signal; providing, at a second terminal of the inductor, an intermediate voltage signal based, at least in part, on the first voltage signal; coupling the second terminal of the inductor to one of a plurality of input terminals of the step-down regulator to provide the intermediate voltage signal to the one of the plurality of input terminals; and converting the intermediate voltage signal, at the one of the plurality of input terminals, into the second voltage signal using the step-down regulator.

In some embodiments of the method disclosed herein, one of the plurality of input terminals is coupled to ground.

In some embodiments of the method disclosed herein, the method can include coupling, via a first switch for a first duration, the second terminal of the inductor to a first input terminal of the plurality of input terminals, and coupling, via a second switch for a second duration, the second terminal of the inductor to a second input terminal of the plurality of input terminals.

In some embodiments of the method disclosed herein, the method can include controlling a ratio of the first duration and the second duration to control the second voltage signal.

In some embodiments of the method disclosed herein, the method can include shorting the first terminal and the second terminal of the inductor using a shunt switch when the voltage regulator is initially powered up to reduce an inrush current.

In some embodiments of the method disclosed herein, the method can include increasing a voltage at the second terminal of the inductor using a shunt regulator when the voltage regulator is initially powered up to reduce an inrush current.

In some embodiments of the method disclosed herein, the output terminal of the switched capacitor regulator in the voltage regulator can be coupled to an input voltage source and the first terminal of the inductor in the receiving regulator can be coupled to a target load of the voltage regulator to operate the voltage regulator in a reverse direction.

There has thus been outlined, rather broadly, the features of the disclosed subject matter in order that the detailed description thereof that follows may be better understood, and in order that the present contribution to the art may be better appreciated. There are, of course, additional features of the disclosed subject matter that will be described hereinafter and which will form the subject matter of the claims appended hereto.

In this respect, before explaining at least one embodiment of the disclosed subject matter in detail, it is to be understood that the disclosed subject matter is not limited in its application to the details of construction and to the arrangements of the components set forth in the following description or illustrated in the drawings. The disclosed subject matter is capable of other embodiments and of being practiced and carried out in various ways. Also, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, systems, methods and media for carrying out the several purposes of the disclosed subject matter. It is important, therefore, that the claims be regarded as including such equivalent constructions insofar as they do not depart from the spirit and scope of the disclosed subject matter.

These together with the other objects of the disclosed subject matter, along with the various features of novelty which characterize the disclosed subject matter, are pointed out with particularity in the claims annexed to and forming a part of this disclosure. For a better understanding of the disclosed subject matter, its operating advantages and the specific objects attained by its uses, reference should be had to the accompanying drawings and descriptive matter in which there are illustrated preferred embodiments of the disclosed subject matter.

BRIEF DESCRIPTION OF THE DRAWINGS

Various objects, features, and advantages of the disclosed subject matter can be more fully appreciated with reference to the following detailed description of the disclosed subject matter when considered in connection with the following drawings, in which like reference numerals identify like elements.

FIGS. 6A-6B illustrate a detailed schematic diagram of FIG. 3 in which the flying switched-inductor regulator at the first stage includes a flipped flying buck regulator in accordance with some embodiments.

DETAILED DESCRIPTION

Figure 1A:
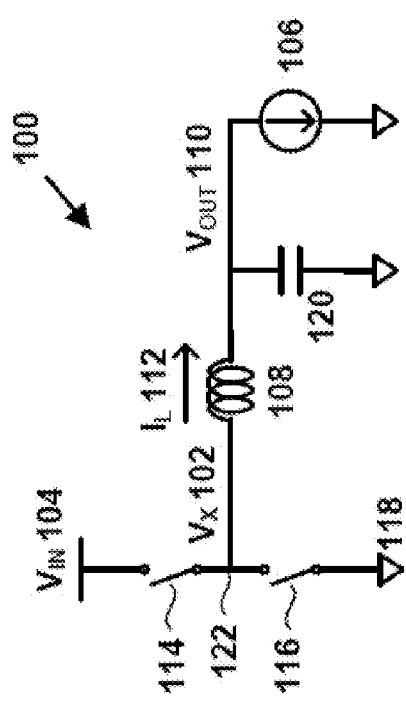
FIGS. 1A-1B illustrate a buck regulator and its operation.

In the following description, numerous specific details are set forth regarding the systems and methods of the disclosed subject matter and the environment in which such systems, methods and media may operate, etc., in order to provide a thorough understanding of the disclosed subject matter. It will be apparent to one skilled in the art, however, that the disclosed subject matter may be practiced without such specific details, and that certain features, which are well known in the art, are not described in detail in order to avoid complication of the disclosed subject matter. In addition, it will be understood that the examples provided below are exemplary, and that it is contemplated that there are other systems and methods that are within the scope of the disclosed subject matter.

Modern electronic systems have been tightly integrated as a system-on-chip (SoC) that incorporates multiple processing cores and heterogeneous components (e.g., memory controllers, hardware accelerators) within a single chip. The popularity of SoCs, coupled with tighter power budgets, motivates controlling the voltage and frequency at a block-specific granularity. The block-specific voltage control can allow the electronic system to raise only the voltage of the core(s) that desires higher performance. Such a block-specific voltage control can improve power and/or performance.

However, traditional approaches of dynamic voltage and frequency scaling (DVFS) have been performed at a coarse-grain level due to cost and size limitations of off-chip voltage regulators. Moreover, traditional DVFS schemes were limited to a slow voltage/frequency scaling at the micro-second timescale due to the slow speed of off-chip voltage regulators. Faster DVFS in nano-second timescale can save significantly more power consumed by the SoC by closely tracking the SoC voltage to the rapidly changing computation demand.

Given these drawbacks of off-chip voltage regulators, there has been a surge of interest in building integrated voltage regulators (IVR) to reduce board size and enable nanosecond timescale, per-core DVFS. An IVR can include a variety of voltage regulators, including a switching regulator and a low-dropout linear regulator. IVRs that can reduce the board size and can enable nanosecond timescale, per-core DVFS are disclosed in articles authored by inventors of the present application, including an article entitled "System Level Analysis of Fast, Per-Core DVFS using On-Chip Switching Regulators," published in IEEE International Symposium on High-Performance Computer Architecture (HPCA) in February 2008, by Wonyoung Kim et al.; an article entitled "Design Techniques for Fully Integrated Switched-Capacitor DC-DC Converters," published in IEEE Journal of Solid-State Circuits (JSSC) in September 2011, by Hanh-Phuc Le et al.; and an article entitled "A Fully-Integrated 3-Level DC/DC Converter for Nanosecond-Scale DVFS," published in IEEE Journal of Solid-State Circuits (JSSC) in January 2012, by Wonyoung Kim et al., each of which is hereby incorporated herein by reference in its entirety.

Figure 1B:
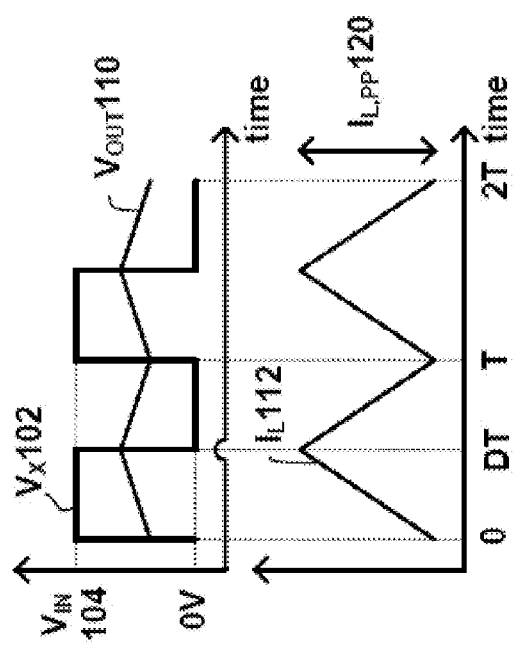

A switching regulator can include a buck regulator. FIGS. 1A-1B illustrate a buck regulator and its operation. As illustrated in FIG. 1A, the buck regulator 100 can include an inductor 108 and two switches 114, 116. The buck regulator 100 can connect the inductor 108 to a first voltage source $V_{IN}$ 104 and a second voltage source 118 through a set of power switches 114, 116. In some cases, the second voltage source 118 can include a ground voltage source. The power switches 114, 116 can be turned on and off using external inputs. In some cases, the power switches 114, 116, can be controlled so that the two switches are not turned on at the same time. The power switches 114, 116 can include transistors. The transistors can include a MOSFET transistor. For example, the switch 114 can include a P-channel MOSFET transistor; the switch 116 can include an N-channel MOSFET transistor.

As illustrated in FIG. 1B, as the power switches 114, 116 turn on and off with a period T, the input of the inductor $V_X$ 102 can swing between 0 and $V_{IN}$ with a period T. The inductor 108 and capacitor 120 operate as a low-pass filter that averages $V_X$ 102 over time, thereby creating a signal at the regulator output $V_{OUT}$ 110 with a small voltage ripple. The output voltage $V_{OUT}$ 110 can depend on the amount of time the inductor 108 is coupled to the first voltage source $V_{IN}$ 104 and the amount of time the inductor 108 is coupled to the second voltage source 118. For example, the buck regulator 100 can adjust the level of $V_{OUT}$ 510 to $V_{IN}D+(0V)(1-D)$, where D, a number between 0 and 1, is the portion of time $V_X$ is coupled to $V_{IN}$. D is also referred to as a duty cycle. The output load that consumes the current 106 can be any type of an electronic device, including processors, memory (DRAM, NAND flash), RF chips, WiFi combo chips, and power amplifiers.

The efficiency η of the buck regulator 100 can be computed as:

$$\eta = \frac{P_L}{P_O}$$

where $P_L$ indicates the power delivered to the output load 106 and $P_O$ indicates the output power of the buck regulator 108. $P_L$ can be computed as follows: $P_L=P_O-P_{LOSS}$, where $P_{LOSS}$ includes the amount of power losses during the voltage regulation process.

One of the major power losses $P_{LOSS}$ associated with a buck regulator 100 includes a resistive loss $P_R$ incurred by the parasitic resistance of the inductor 108. When the buck regulator 100 delivers power to the output load 106 by providing current 112, ideally, the buck regulator 100 provides all of its output power to the output load 106. However, in a practical scenario, the buck regulator 100 dissipates some of its output power internally at the inductor 108. Ideally, an inductor 108 has zero resistance. Therefore, a current through the inductor 108 would not dissipate any power. However, in a practical scenario, an inductor 108 is associated with a finite resistance, primarily due to the resistance of the material forming the inductor 108. This undesirable, finite resistance of the inductor 108 is referred to as a parasitic resistance. The parasitic resistance can incur a resistive power loss since the parasitic resistance can cause the current through the inductor 108 to dissipate energy. Therefore, the resistive power loss can reduce the power conversion efficiency of the buck regulator 100.

When the current is alternating, then the resistive power loss can be computed as $P_R=I_{L,RMS}^2 R_L$, where $R_L$ is the value of the parasitic resistance of the inductor 108, and $I_{L,RMS}$ is the root-mean square of the current through the inductor 108. $I_{L,RMS}$ can be reduced by reducing the peak-to-peak ripple of the inductor current ($I_{L,PP}$ 120). Therefore, the buck regulator 100 can reduce the resistive loss $P_R$ by reducing the peak-to-peak ripple of the inductor current $I_{L,PP}$ 120.

There are two ways to reduce the peak-to-peak ripple of the inductor current $I_{L,PP}$ 120. First, the buck regulator 100 can switch at a high frequency and reduce the period of the switching regulator T. However, this solution can increase the power consumed to charge and discharge the parasitic capacitance at the junction 122 between switches 114, 116. This capacitive power loss can be significant because the size of the switches 114, 116 can be large, which increases the parasitic capacitance, and because the voltage swing on $V_X$ 102 is large. This capacitive power loss can be computed as follows: $P_C=fCV^2$, where f is the frequency at which the buck regulator 100 switches, C is the amount of the parasitic capacitance at the junction 122, and V is the voltage swing at the junction 122. This power loss can be significant because the size of the switches 114, 116 is large, which increases the parasitic capacitance, and because the voltage swing on $V_X$ 102 is large.

Second, the buck regulator 100 can use an inductor 108 with a high inductance value, thereby reducing the parasitic resistance $R_L$. However, this approach makes the inductor 108 large and makes integration difficult.

A switching regulator can also include a switched-capacitor (SC) regulator. An SC regulator can use one or more capacitors, instead of inductors, to transfer charges from a power source to an output load. An SC regulator can use power switches to coupled/disconnect one or more capacitors to one of multiple voltages, thereby providing an output voltage that is a weighted average of the multiple voltages. The SC regulator can control the output voltage by changing the configuration and the sequence in which capacitors are coupled to one another. Because capacitors are easier to integrate on-die or on-package than inductors, it is easier to implement SC IVRs with a small size.

However, efficiencies of SC regulators can degrade at output voltages that are not a predetermined fraction of the input voltage. For example, a SC regulator can achieve high efficiencies at ½, ⅓, ⅔, ⅖, ⅗ of the input voltage. However, the same SC regulator can fail to provide high efficiencies when the output voltage deviates from those values. This is a problem for many SoCs that operate within a continuous range of voltages, or a range of voltages in 5-10 mV steps.

Figure 2A:
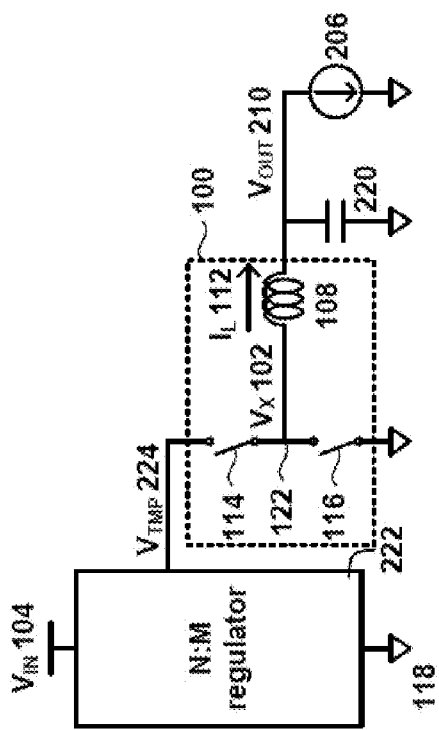
FIGS. 2A-2B illustrate a voltage regulator that includes a step-down regulator at the first-stage and an inductor-based buck regulator at the second stage.
Figure 2B:
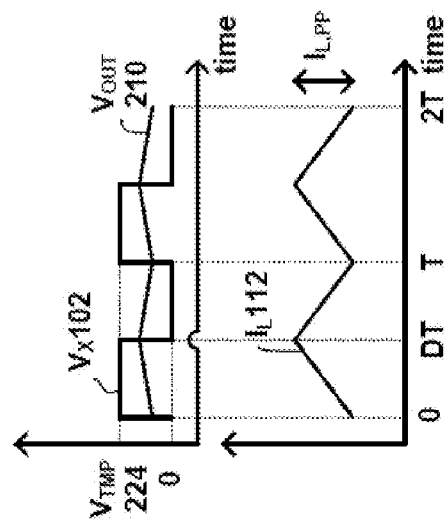

Some of the challenges associated with the SC regulator can be addressed by operating the SC regulator to provide an output voltage at which the SC regulator can provide a high efficiency, and subsequently regulating the output voltage of the SC regulator using a buck converter. FIGS. 2A-2B illustrate a power converter that includes an SC regulator and a buck regulator in two stages. FIG. 2A includes an SC regulator 222 and a buck regulator 100. The SC regulator 222 can convert the input voltage 104 to $V_{TMP}$ 224, which is a fraction of the input voltage at which the SC regulator can provide high efficiency. For example, $V_{TMP}$ 224 can be $V_{IN}/N$, where N is the step-down ratio. Then the buck regulator 100 can receive $V_{TMP}$ 224 and regulate it to provide $V_{OUT}$ 210 in fine steps using multiple power switches 114, 116 and one or more inductors 108. FIG. 2B illustrates the timing diagram of signals in the regulator.

This regulator hinges on the fact that SC regulators are good at dividing voltages across predetermined fractional values and that buck regulators are good at regulating across a wide range of output voltages in fine steps. For example, in a 12V-to-1V step-down regulator, the SC regulator 222 can receive 12V at $V_{IN}$ 104 and provide a ⅙ step-down, thereby providing 2V at $V_{TMP}$ 224. Subsequently, the buck regulator 100 can provide a subsequent regulation to regulate 2V to 1V. Since this regulator reduces the voltage swing at $V_X$ 202 to $V_{TMP}$ 224, which can be substantially less than $V_{IN}$ 104, this regulator can reduce the capacitive power loss due to the parasitic capacitance at the junction 122. However, this regulator can still suffer from resistive power loss ($I_{L,RMS}^2 R$ loss) since the full amount of current required by the load 206 has to flow through the inductor 208. To reduce the resistive loss incurred by the current, the inductor needs to have a low resistance, which can be hard to achieve in a small die area (e.g., a small footprint).

The present disclosure shows a hybrid regulator topology that can be more easily integrated and that can maintain high efficiency across a wide output and input voltage range, even with a small inductor. The hybrid regulator topology can include two types of regulators: a flying switched-inductor regulator and a step-down regulator. A flying switched-inductor regulator can include a plurality of switches and an inductor that are arranged to change a voltage level of a source voltage to a target voltage; a step-down regulator can include a plurality of switches and a plurality of capacitors that are configured to divide a voltage level of a source voltage into an M/N fraction of the source voltage. The disclosed embodiments of the hybrid regulator topology can reduce the capacitive loss ($CV^2 f$ loss) of the flying switched-inductor regulator by limiting the voltage swing across the switches in the flying switched-inductor regulator. The disclosed embodiments of the hybrid regulator topology can also reduce the inductor resistive loss of the flying switched-inductor regulator by operating the flying switched-inductor regulator at a high switching frequency and with a small amount of current flow through the inductor. This approach can reduce the resistive loss of the flying switched-inductor regulator even with a small inductor with a low inductance.

In some embodiments, the disclosed embodiments of the hybrid regulator topology can be configured in a step-down configuration: a configuration in which an input voltage of the hybrid regulator is higher than an output voltage of the hybrid regulator. In other embodiments, the disclosed embodiments of the hybrid regulator topology can be configured in a step-up configuration: a configuration in which an input voltage of the hybrid regulator is lower than an output voltage of the hybrid regulator.

In some embodiments, the hybrid regulator can be bi-directional. In a bi-directional hybrid regulator, an input voltage and an output voltage of the hybrid regulator can be swapped (or flipped) to operate a step-down hybrid regulator in a step-up manner or to operate a step-up hybrid regulator in a step-down manner. For example, the input voltage can be provided to an output terminal of the hybrid regulator and the output voltage can be tapped from the input terminal of the hybrid regulator. This way, a step-down hybrid regulator can be operated in a step-up manner, or a step-up hybrid regulator can be operated in a step-down manner.

Figure 3:
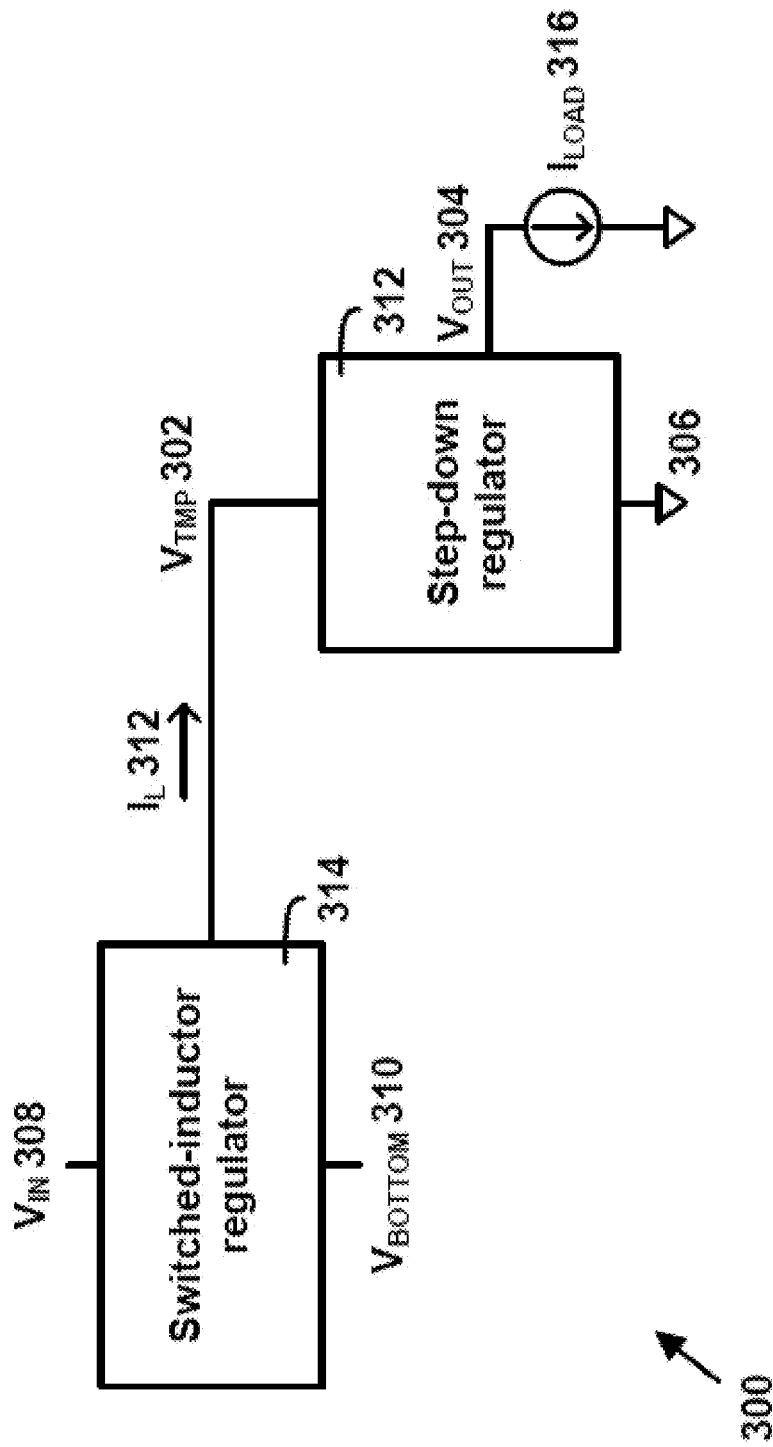
FIG. 3 illustrates a high-level diagram of a voltage regulator that includes a flying switched-inductor regulator at the first stage and a step-down regulator at the second stage, in accordance with some embodiments.

FIG. 3 illustrates a hybrid regulator topology in accordance with some embodiments. FIG. 3 includes a hybrid regulator 300 that includes a switched-inductor regulator 314 and a step-down regulator 312. The switched-inductor regulator 314 receives a plurality of voltages, for example, $V_{IN}$ 308 and $V_{BOTTOM}$ 310, and provides as output $V_{TMP}$ 302, which is a weighted average of two or more of the plurality of voltages, to the step-down regulator 312. The step-down regulator 312 can subsequently step-down $V_{TMP}$ 302 to the desired output voltage 304. In some embodiments, the step-down regulator 312 can include an N:M regulator, such as a switched capacitor regulator. The N:M regulator is configured to reduce the received voltage $V_{TMP}$ to a fraction of M/N:

$$\frac{M}{N} V_{TMP}.$$

Some examples of N:M include 1:1, 2:1, 3:1, 3:2, 4:1, 4:3, 5:1, 5:2, 5:3, 5:4, 6:5, 7:1, 7:2, 7:3, 7:4, 7:5, 7:6, or any other suitable fraction.

In some embodiments, the switched-inductor regulator 314 and the step-down regulator 312 can operate at the same switching frequency (e.g., frequency at which the switches in the switched-inductor regulator 314 and the step-down regulator 312 are controlled). In other embodiments, the switched-inductor regulator 314 and the step-down regulator 312 can operate at two different switching frequencies. The operating frequency of the switched-inductor regulator 314 and the step-down regulator 312 can be determined based on an input clock signal. In some cases, the input clock signal for the switched-inductor regulator 314 and the step-down regulator 312 can be received from an external clock source; in other cases, the input clock signal for the switched-inductor regulator 314 and the step-down regulator 312 can be generated by a phase locked loop (PLL) integrated on the same chip as the switched-inductor regulator 314 and the step-down regulator 312. In some examples, the PLL can generate two or more clock signals with different frequencies.

In some embodiments, the switched-inductor regulator 314 can include a flying switched-inductor regulator. In a regular switched-inductor regulator 314, the $V_{BOTTOM}$ 310 is tied to a ground signal (0V). However, in a flying switched-inductor regulator, the $V_{BOTTOM}$ 310 is set to be non-zero. For example, in a flying switched-inductor regulator, the $V_{BOTTOM}$ 310 is set to be greater than 0V.

Figures 4A, 4B:
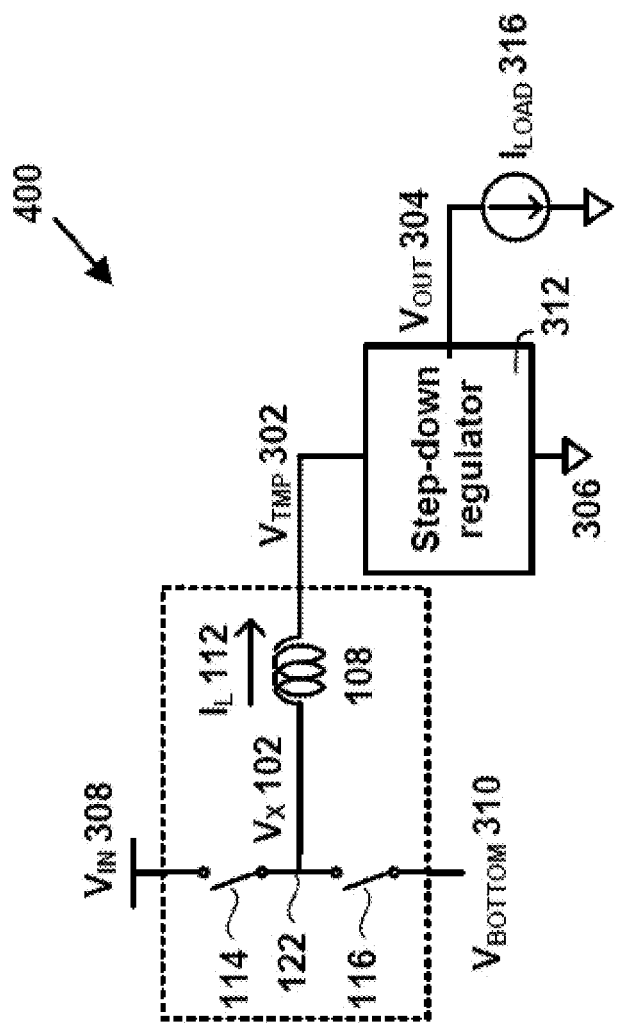
FIGS. 4A-4B illustrate a detailed schematic diagram of FIG. 3 in which the flying switched-inductor regulator at the first stage includes a flying buck regulator, in accordance with some embodiments.

In some embodiments, the flying switched-inductor regulator 314 can include a flying buck regulator. FIG. 4 illustrates a hybrid regulator having a flying buck regulator in accordance with some embodiments. The flying buck regulator can operate between $V_{IN}$ 308 and $V_{BOTTOM}$ 310, and the flying buck regulator can be coupled to an N:M regulator 412.

The hybrid regulator 400 can reduce the resistive loss ($I_{L,RMS}^2 R$ loss) through the inductor 108 of the flying buck regulator, thereby improving the voltage conversion efficiency. Because the N:M regulator is configured to step down an input voltage $V_{TMP}$ 302 by $$\frac{M}{N},$$

$V_{TMP}$ 302 is, for the most part, higher than $V_{OUT}$. Assuming that the N:M regulator's efficiency is high, the power drawn by the output load is roughly equivalent to the power drawn by the N:M regulator, which is in turn equal to the power provided by the flying buck regulator. Therefore, based on the well-known power equation: power equals voltage multiplied by current (P=VI), the current $I_L$ 112, provided by the flying buck regulator 314, is roughly $$\frac{M}{N} I_{LOAD},$$

where $I_{LOAD}$ 316 is the current drawn at the output load. Since M is often smaller than N, the flying buck regulator 314 only needs to provide a fraction of $I_{LOAD}$ to the N:M regulator. Therefore, this regulator topology can reduce the resistive loss ($I_{L,RMS}^2 R$ loss) through the inductor to roughly $(M/N)^2$. Furthermore, the reduction of the resistive loss becomes larger as the conversion ratio (M:N ratio) becomes larger. The resistive loss reduction is achieved by an observation that power equals current multiplied by voltage (P=VI). When a fixed amount of power is delivered, it is desirable to provide the power with a high voltage, which allows for delivering only a small amount of current.

The hybrid regulator 400 can also reduce the capacitive power loss ($CV^2 f$ loss) of the flying switched-inductor regulator 314. In particular, the capacitive loss ($CV^2 f$ loss) can be reduced by controlling $V_{BOTTOM}$ 310. For example, $V_{BOTTOM}$ 310 can be any value between 0V and $V_{IN}$ 308. Since the capacitive loss can be reduced by reducing the voltage swing across the switches, the capacitive loss ($CV^2 f$ loss) can be reduced by increasing $V_{BOTTOM}$ 310 wherever possible.

In some embodiments, when $V_{BOTTOM}$ 310 is significantly smaller than $V_{IN}$ 308, then the voltage across switches 114, 116 can be large. To address the large voltage across the switches 114, 116, the switches 114, 116 can be formed using transistors that can withstand a large voltage across terminals. For example, the switches 114, 116 can be formed using thick-oxide transistors, such as thick-oxide MOSFET transistors. In other examples, the switches 114, 116 can be formed using Gallium Nitride (GaN) transistors, or any other suitable transistors or combination of transistors.

In other embodiments, when $V_{BOTTOM}$ 310 is not significantly smaller than $V_{IN}$ 308, the switches 114, 116 can be formed using regular thin-oxide transistors, such as thin-oxide MOSFET transistors.

In some embodiments, the flying switched-inductor regulator in the hybrid regulator 400 can also include a multi-phase flying buck regulator with two or more phases. The multi-phase flying buck regulator can include a plurality of parallel flying buck regulators that operate in a time-interleaved manner over a single period T. For example, a 3-phase flying buck regulator can include three sets of switches and inductors that each operate 0 degrees, 120 degrees, 240 degrees out of phase.

Figure 5A:
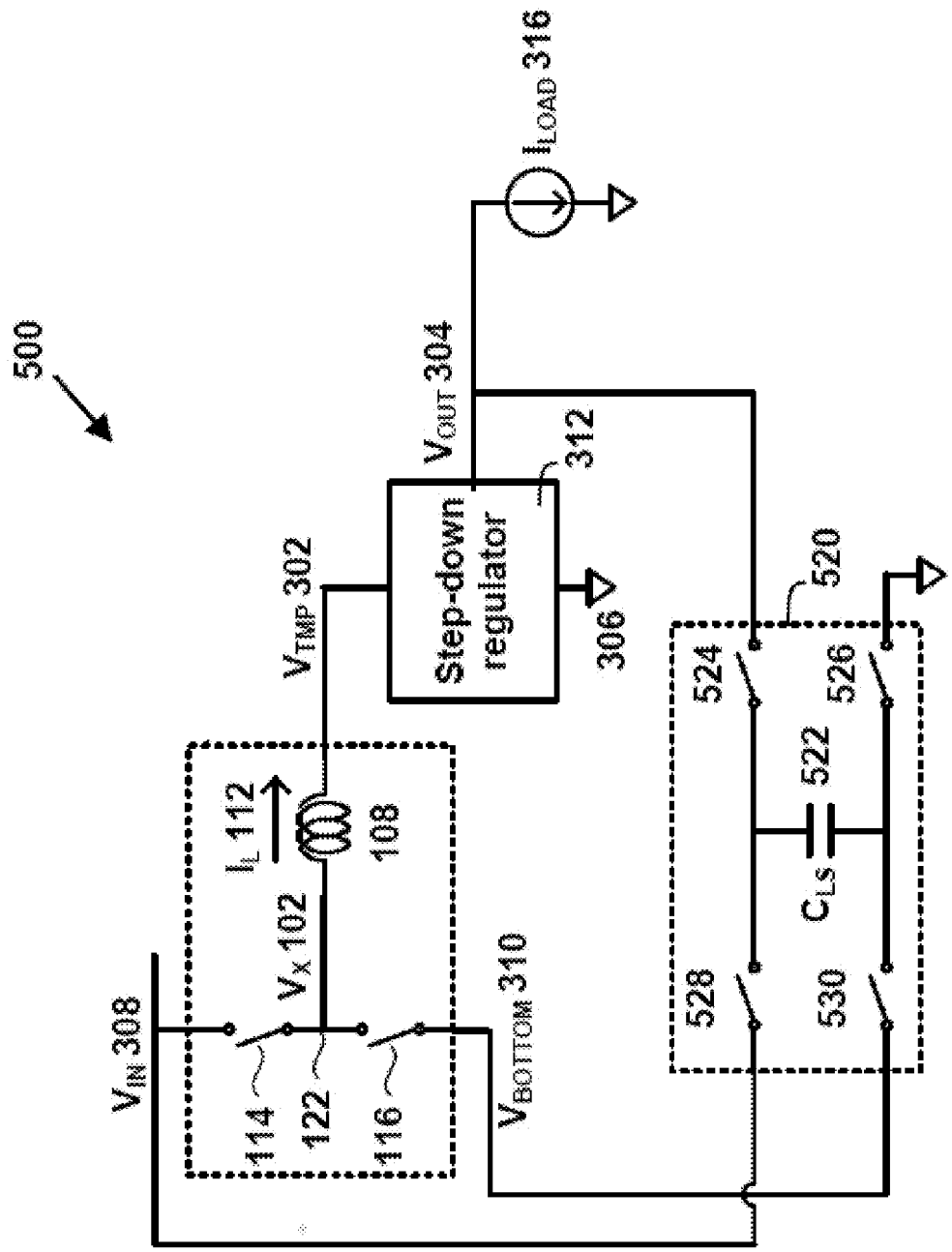
FIGS. 5A-5D illustrate a detailed schematic diagram and its operation of FIG. 3 in which the flying switched-inductor regulator at the first stage includes a flying buck regulator with a flying capacitor in accordance with some embodiments.

In some embodiments, the $V_{BOTTOM}$ 310 provided to the flying switched-inductor regulator can be based on the output voltage of the step-down regulator. FIGS. 5A-5D illustrate a hybrid regulator in which $V_{BOTTOM}$ 310 for the flying buck regulator is generated based on the output voltage of the step-down regulator in accordance with some embodiments. The hybrid regulator 500 includes a flying switched-inductor regulator and an N:M regulator 312. FIG. 5A illustrates an embodiment in which the flying switched-inductor regulator includes a flying buck regulator, but the flying switched-inductor regulator can also include other types of flying switched-inductor regulators. The flying buck regulator is configured to receive $V_{IN}$ 308 and $V_{BOTTOM}$ 310 and to provide $V_{TMP}$ 302 to the N:M regulator 312. Subsequently, the N:M regulator 312 can step down $V_{TMP}$ 302 to provide $V_{OUT}$ 304.

In some embodiments, $V_{BOTTOM}$ 310 can be based on the output voltage $V_{OUT}$ 304. In particular, $V_{BOTTOM}$ 310 can be set as $V_{IN}$-$V_{OUT}$. The hybrid regulator 500 can generate the $V_{BOTTOM}$ 310 using a level-shifting converter 520. In some embodiments, the level-shifting converter 520 can include a flying capacitor ($C_{LS}$) 522 and a plurality of switches 524-530.

Figures 5B, 5C:
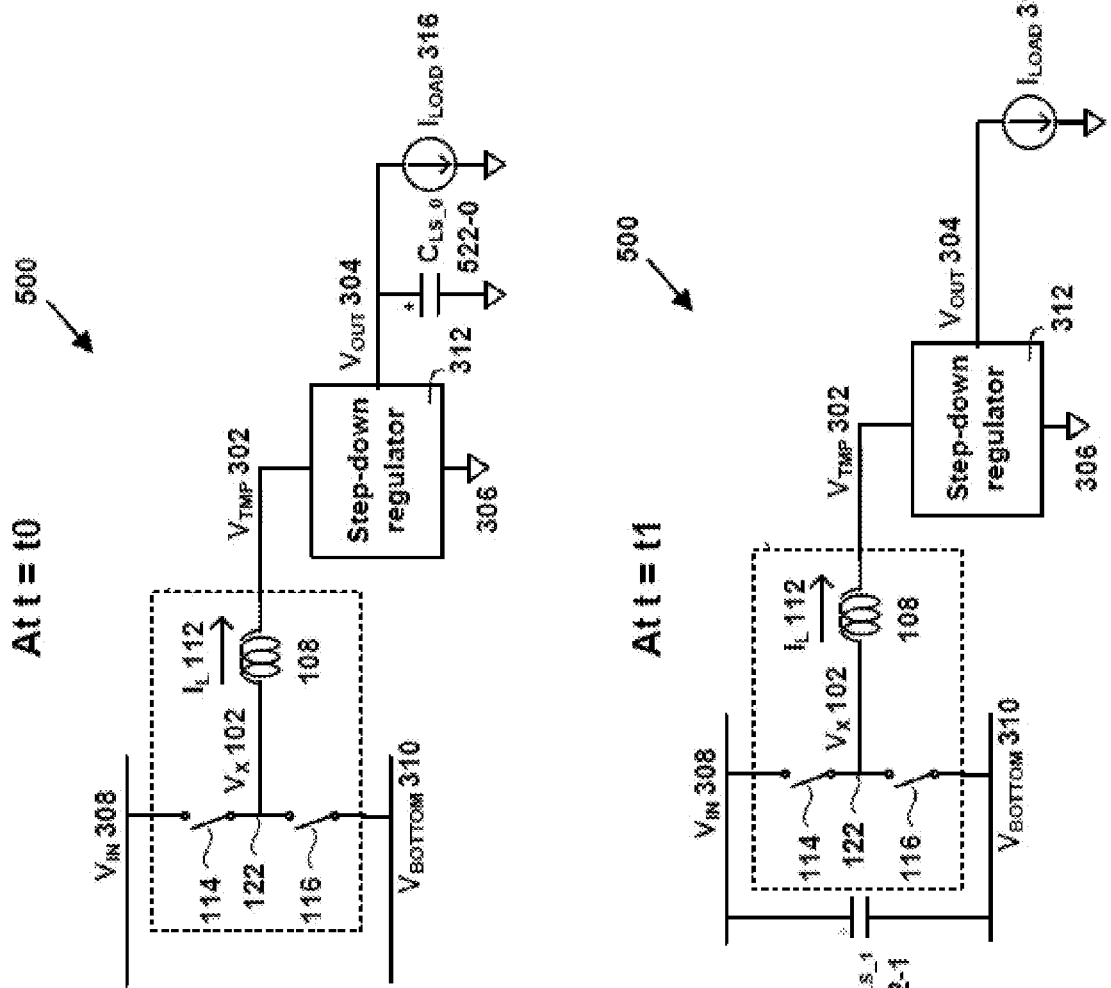
Figure 5D:
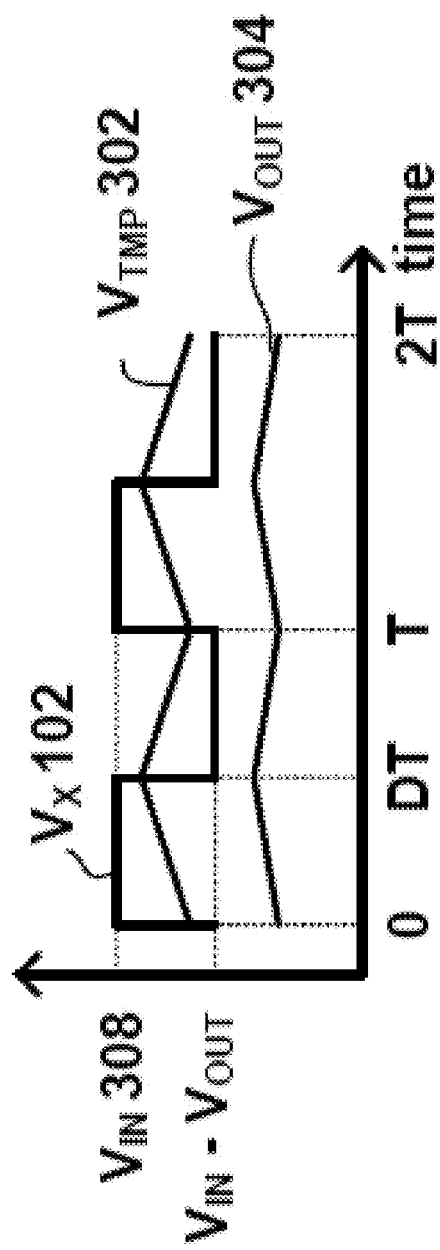

The level-shifting converter 520 can provide $V_{IN}$-$V_{OUT}$ as $V_{BOTTOM}$ 310 by turning on two of the switches 524-530 at a time. For example, as illustrated in FIG. 5B, at time t0, the hybrid regulator 500 can provide the flying capacitor 522 in parallel with the output load, illustrated as $C_{LS\_0}$ 522, by turning on switches 524, 526 and turning off switches 528, 530. This charges up the flying capacitor 522 to $V_{OUT}$ 304. At time t1, which is a predetermined time after t0, as shown in FIG. 5C, the hybrid regulator 500 can provide the flying capacitor 522 in parallel with the flying buck regulator, illustrated as $C_{LS\_1}$ 522-1, by turning off switches 524, 526 and turning on switches 528, 530. By providing the plate with a positive charge to $V_{IN}$ 304 and by providing the plate with a negative charge to $V_{BOTTOM}$ 310, $V_{BOTTOM}$ 310 can be set as $V_{IN}$-$V_{OUT}$. FIG. 5D illustrates the timing diagram of signals in the hybrid regulator of FIG. 5A. FIG. 5D illustrates that the internal node Vx 102 swings between $V_{IN}$ 304 and $V_{IN}$-$V_{OUT}$. Vx 102 is subsequently low-pass filtered by the inductor to generate $V_{TMP}$ 302, which is further stepped-down by the step-down regulator 312 to generate $V_{OUT}$ 304.

In some embodiments, the period in which the flying capacitor 522 switches between two locations $C_{LS\_0}$ 522-0 and $C_{LS\_1}$ 522-1 can be equivalent to the period in which the switches in the flying buck regulator turns on and off. In some cases, the flying capacitor 522 can be switched between two locations $C_{LS\_0}$ 522-0 and $C_{LS\_1}$ 522-1 synchronously with the turning on and off of the switches in the flying buck regulator. For example, when the switch 114 is turned on and the switch 116 is turned off, the flying capacitor 522 can be provided at $C_{LS\_0}$ 522-0; when the switch 114 is turned off and the switch 116 is turned on, the flying capacitor 522 can be provided at $C_{LS\_1}$ 522-1. In other embodiments, the period in which the flying capacitor 522 switches between two locations $C_{LS\_0}$ 522-0 and $C_{LS\_1}$ 522-1 can be equivalent to an integer multiple of the period in which the switches in the flying buck regulator turns on and off.

In some embodiments, the flying capacitor 522 can have a high capacitance value. For example, the capacitance of the flying capacitor 522 can be between 0.1-100 nF, or any other suitable capacitance values. A high capacitance flying capacitor 522 can prevent the voltage across the flying capacitor 522 (and thus the voltage across the flying buck regulator) from changing significantly over time.

In some embodiments, the level-shifting converter of the hybrid regulator 500 can include a separate buck converter. In other embodiments, the level-shifting converter can include a multi-phase converter with two or more phases, where multiple flying capacitors operate in an interleaved manner.

In some embodiments, the input and output terminals of a flying buck regulator of a hybrid regulator can be flipped. Such a flying buck regulator can be referred to as a flipped flying buck regulator. The flipped flying buck regulator can also be referred to as a flying switched-inductor regulator because it has a topology of a flying buck regulator that is flipped along a vertical axis. While this new topology is referred to as a flying switched-inductor regulator, the power distribution mechanism of this flying switched-inductor regulator can be substantially different from the regular flying buck regulator, as discussed below.

FIGS. 6A-6B illustrate a hybrid regulator having a flying switched-inductor regulator in accordance with some embodiments. The hybrid regulator 600 can include a flying switched-inductor regulator 614, which is coupled to the N:M regulator 312. The flying switched-inductor regulator 614 can include a flipped flying buck regulator, which includes an inductor 608 and a plurality of switches 616, 618. Unlike conventional flying buck regulators, the flipped flying buck regulator 614 is coupled to $V_{IN}$ 308 via the inductor 608, and provides two voltages $V_{N:M\_TOP}$ 620 and $V_{N:M\_BOTTOM}$ 622 to the N:M regulator 312. Subsequently, the N:M regulator 312 can use $V_{N:M\_TOP}$ 620 and $V_{N:M\_BOTTOM}$ 622 to generate an output voltage $V_{OUT}$ 304.

In the flying switched-inductor regulator 614, the input voltage $V_{IN}$ 308 is equivalent to the weighted average of the two voltages provided to the N:M regulator: $V_{N:M\_TOP}$ 620 and $V_{N:M\_BOTTOM}$ 622. This is different from previous embodiments because the flying switched-inductor regulator is flipped across the vertical axis of the illustration and the node that used to be the output is now coupled to $V_{IN}$ 308, which can be a fixed voltage.

The flying switched-inductor regulator 614 can be configured so that the input voltage $V_{IN}$ 308 coupled to the inductor 608 is equivalent to $V_{N:M\_TOP}D+V_{N:M\_BOTTOM}(1-D)$, where D, a number between 0 and 1, is the duty cycle in which $V_X$ 602 is coupled to $V_{N:M\_TOP}$. Since $V_{IN}$ is fixed, $V_{N:M\_TOP}$ 620 and $V_{N:M\_BOTTOM}$ 622 are configured to change depending on how long $V_X$ 602 stays coupled to $V_{N:M\_TOP}$ 620 and how long $V_X$ 602 stays coupled to $V_{N:M\_BOTTOM}$ 622. FIG. 6B illustrates the timing diagram of signals in the hybrid regulator of FIG. 6A. FIG. 6B illustrates that the input voltage $V_{IN}$ 308 coupled to the inductor 608 is a fixed voltage. This fixed input voltage $V_{IN}$ 308 is used to generate two separate voltages, $V_{N:M\_TOP}$ 620 and $V_{N:M\_BOTTOM}$ 622, which are also fixed voltages. The internal node $V_X$ 602 is switched between $V_{N:M\_TOP}$ 620 and $V_{N:M\_BOTTOM}$ 622 at a duty cycle of D. The step-down regulator 312 uses $V_{N:M\_TOP}$ 620 and $V_{N:M\_BOTTOM}$ 622 as two inputs to generate an output voltage $V_{OUT}$ 304.

Figure 7A:
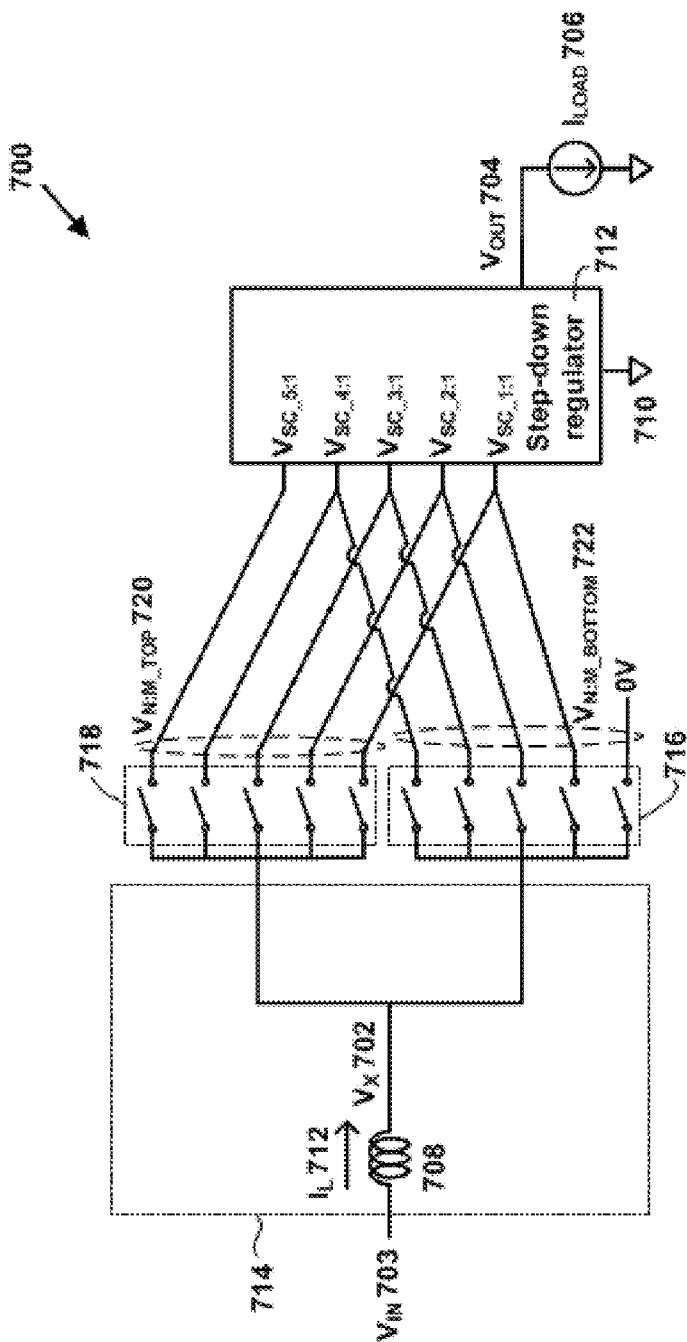
FIGS. 7A-7B illustrate a detailed schematic diagram of FIGS. 6A-B in which the N:M regulator includes a switched-capacitor regulator in accordance with some embodiments.
Figure 7B:
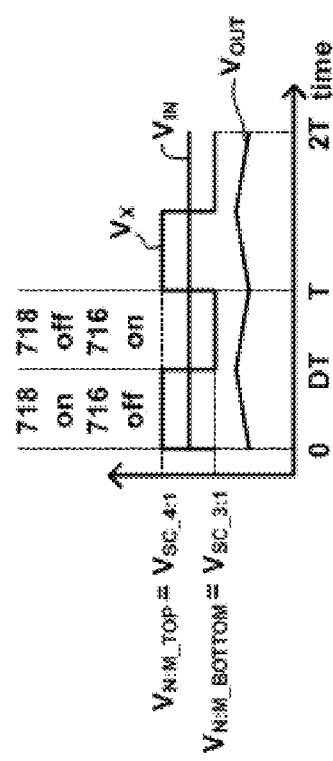

FIGS. 7A-7B show an exemplary embodiment of a hybrid regulator having a flying switched-inductor regulator in accordance with some embodiments. FIG. 7A shows a hybrid regulator 700 having a flying switched-inductor regulator 714, which includes an inductor 708. FIG. 7A also includes a first set of switches 716 and a second set of switches 718. Each switch in the first set of switches 716 and the second set of switches 718 can couple $V_{N:M\_TOP}$ 620 and $V_{N:M\_BOTTOM}$ 622 to one of the input nodes of the step-down regulator 712 or ground (0V).

The step-down regulator 712 can include a plurality of N:M regulators. For example, in FIG. 7A, the step-down regulator 712 includes a 1:1 regulator, a 2:1 regulator, a 3:1 regulator, a 4:1 regulator, and a 5:1 regulator. In some embodiments, these N:M regulators (5:1, 4:1, 3:1, 2:1, 1:1) can be implemented as a separate regulator. In other embodiments, these N:M regulators (5:1, 4:1, 3:1, 2:1, 1:1) can be implemented as a single reconfigurable SC regulator that shares switches and capacitors. In yet other embodiments, two or more of these N:M regulators can be implemented as a single reconfigurable SC regulator, and the rest of these N:M regulators can be implemented as separate regulators.

The step-down regulator 712 can include a plurality of input nodes, each coupled to one of the N:M regulators in the step-down regulator 712. For example, in FIG. 7A, the step-down regulator 712 includes 5 input nodes: $V_{SC\_5:1}$, $V_{SC\_4:1}$, $V_{SC\_3:1}$, $V_{SC\_2:1}$, $V_{SC\_1:1}$. The step-down regulator 712 also includes an output node, which provides an output voltage of one of the N:M regulators.

The first set of switches 716 and the second set of switches 718 can be operated in a time multiplexed manner. For example, at one point in time, none or one of the switches in the first set of switches 716 can be turned on. Likewise, at one point in time, none or one of the switches in the second set of switches 718 can be turned on. When one of the first set of switches 716 is turned on, then none of the second set of switches 718 is turned on; when none of the first set of switches 716 is turned on, then one of the second set of switches 718 is turned on. As described in FIG. 7B, one switch in 718 and one switch in 716 can turn on and off to create a square wave at $V_X$ 702.

In some embodiments, the duration in which $V_{N:M\_TOP}$ 720 and $V_{N:M\_BOTTOM}$ 722 is coupled to $V_X$ 702 can be controlled to control $V_{OUT}$ 704. For example, suppose $V_{IN}$ is 3.7V, which is a typical Li-Ion battery voltage; $V_{N:M\_TOP}$ 720 is coupled to $V_{SC\_4:1}$ via the second set of switches 718; $V_{N:M\_BOTTOM}$ 722 is coupled to $V_{SC\_3:1}$ via the first set of switches 716; and the target $V_{OUT}$ 704 is 1V. Since $V_{OUT}$ is 1V, $V_{SC\_4:1}$ is 4V $V_{SC\_3:1}$ is 3V. Since $V_{IN}$ equals $V_{N:M\_TOP}D+V_{N:M\_BOTTOM}(1-D)$ and $V_{IN}$ is 3.7V and $V_{N:M\_TOP}$ and $V_{N:M\_BOTTOM}$ are coupled to $V_{SC\_4:1}$ (4V) and $V_{SC\_3:1}$ (3V), respectively, the duty cycle of the flying switched-inductor regulator (D) should be 0.7. In other words, the flying switched-inductor regulator can be coupled to $V_{SC\_4:1}$ 70% of the time and be coupled to $V_{SC\_3:1}$ the remaining 30% of the time. As another example, if the target voltage $V_{OUT}$ 704 changes to 0.95V, $V_{N:M\_TOP}$ and $V_{N:M\_BOTTOM}$ can remain coupled to $V_{SC\_4:1}$ (3.8V) and $V_{SC\_3:1}$ (2.85V), respectively, but D can change to 0.89. This D is derived from the equation 3.7=3.8D+2.85(1−D), which comes from $V_{IN}=V_{N:M\_TOP}D+V_{N:M\_BOTTOM}(1-D)$. As another example, if the target voltage $V_{OUT}$ 704 changes to 0.9V, $V_{N:M\_TOP}$ and $V_{N:M\_BOTTOM}$ can be coupled to $V_{SC\_5:1}$ (4.5V) and $V_{SC\_4:1}$ (3.6V), respectively, and D can change to 0.11. FIG. 7B illustrates the timing diagram of signals in the hybrid regulator. In FIG. 7B, one of the first set of switches 716 is configured to couple $V_{SC\_3:1}$ to $V_{N:M\_BOTTOM}$, and one of the second set of switches 718 is configured to couple $V_{SC\_4:1}$ to $V_{N:M\_TOP}$. As illustrated in FIG. 6B, $V_{SC\_3:1}$ and $V_{SC\_4:1}$ can be duty-cycled to generate $V_{OUT}$ 704.

In some embodiments, the first set of switches 716 and the second set of switches 718 can be a part of the flying switched-inductor regulator. In other embodiments, the first set of switches 716 and the second set of switches 718 can be a part of the step-down regulator 712. For example, the step-down regulator 712 can determine which one of the switches in the first set of switches 716 and the second set of switches 718 can be coupled to $V_{N:M\_TOP}$ and $V_{N:M\_BOTTOM}$, and the flying switched-inductor regulator can determine the value of D (duty cycle).

Figure 8:
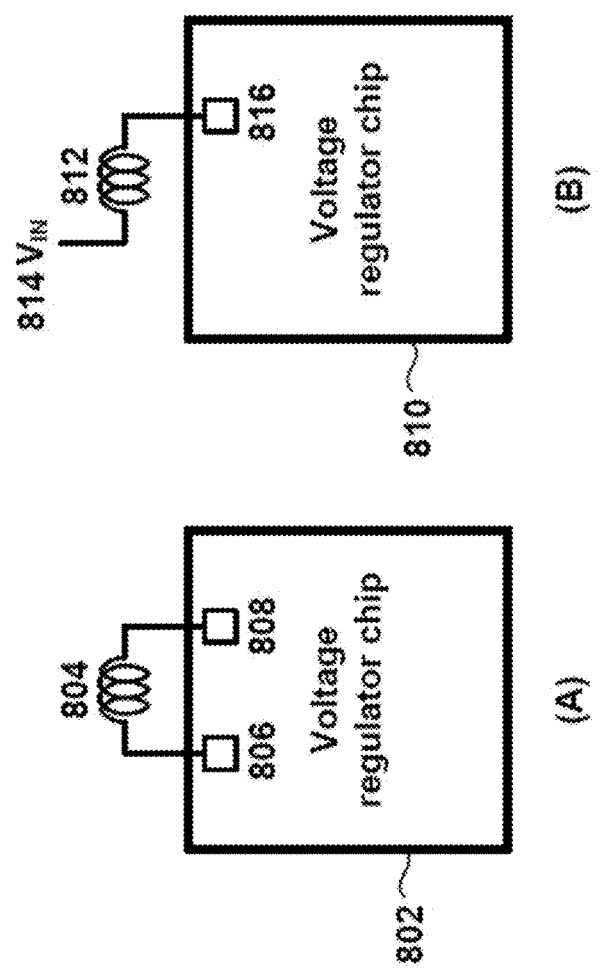
FIGS. 8A-B illustrate a block diagram showing configurations of an inductor coupled to a voltage regulator chip in accordance with some embodiments.

The embodiment illustrated in FIG. 7A can reduce the parasitic capacitance and parasitic resistance associated with the inductor 708. FIGS. 8A-8B illustrate how an inductor can be coupled to a hybrid regulator in accordance with some embodiments. FIG. 8A illustrates how an inductor can be coupled to two or more internal nodes of the chip; FIG. 8B illustrates how an inductor can be coupled to one internal node of the chip. In some embodiments, the inductors can be implemented on the same die as the voltage regulator, but on different metal layers. In this case, the pads 806, 808 can be implemented using vias. In some embodiments, the inductors can be implemented on a different die as the voltage regulator or are discrete components that are placed externally. In this case, the pads, 806, 808 can be implemented as regular pads on the voltage regulator die. In either type of embodiments, there are parasitic losses associated with the pads 806, 808 due to parasitic capacitance and/or parasitic inductance.

In embodiments illustrated in FIGS. 3-5, the inductor is coupled to two internal nodes of the hybrid regulator. For example, the inductor in the buck regulator/flying buck regulator of the hybrid regulator is coupled to two internal nodes of the hybrid regulator. In this case, the output current of the buck regulator/flying buck regulator can flow out through 806, through the inductor 804, and then flows back in through 808. Therefore, the hybrid regulator is affected by the parasitic losses of both pads 806, 808.

In contrast, in embodiments illustrated in FIGS. 6-7, the inductor is coupled to only one internal node of the hybrid regulator. For example, the inductor in the flying switched-inductor regulator is coupled to $V_{IN}$ 814 and an internal node of the hybrid regulator. In this case, the current of the flying switched-inductor regulator can flow through the inductor 812 and flows into the voltage regulator die through 816. Therefore, the current flows through only one of the pads 806, 808, which can reduce the parasitic loss.

In embodiments illustrated in FIGS. 3-7, all N:M regulators can include a flying switched-inductor or switched-capacitor or a hybrid of the two, comprising one or more switches connecting/disconnecting one or more capacitors or one or more inductors. The N:M regulators can also be reconfigurable regulator structures that dynamically change to different conversion ratios (e.g., (N−1):M (N−2):M, N:(M−1), N:(M−2), (N−1):(M−1), etc.). A typical inductance of the inductor in the flying switched-inductor regulator can range from 100 pico-Henry to 1 micro-Henry and power switches in the flying switched-inductor regulator can typically have width/(minimum length) values of 1000 to 100,000. For example, in a 90 nm process technology, power switch widths typically range from 100 um to 10 mm. Switching frequencies typically range from 10 MHz to 500 MHz.

As illustrated above, the N:M regulator can be implemented using a SC regulator. In some cases, the SC regulator may not be able to step down the input voltage $V_{TMP}$ to $$\frac{M}{N}V_{TMP}.$$

Instead, the SC regulator can provide, as $V_{OUT}$, $$\frac{M}{N}V_{TMP} - V_{DELTA},$$

where $V_{DELTA}$ is a small value. For example, in 90 nm processes, $V_{DELTA}$ is in the range of 0-200 mV. In some cases, $V_{DELTA}$ can exist because of the non-ideal characteristics of the SC regulator. For example, the non-ideal characteristics can include the parasitic capacitance. However, oftentimes $V_{DELTA}$ is can be substantially small compared to the output voltage. In some cases, the efficiency of the SC regulator can be the highest when $$V_{OUT} = \frac{M}{N}V_{TMP} - V_{DELTA}.$$

In some embodiments, the hybrid regulators disclosed in FIGS. 3-7 can be controlled using a feedback system. The feedback system can determine, in substantially real time, whether the output voltage of the hybrid regulator is within the tolerable error range from the target output voltage.

Figure 9:
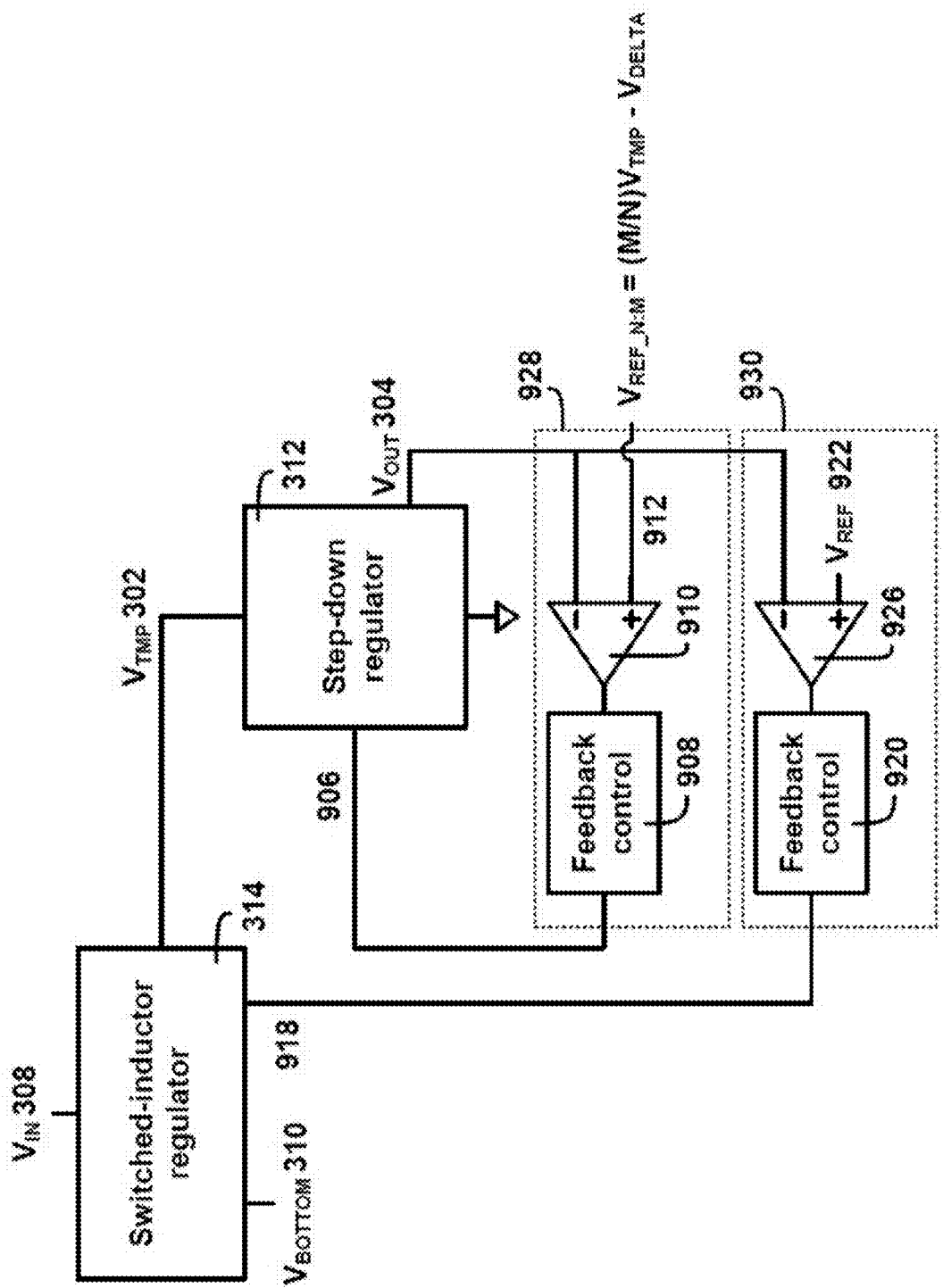
FIG. 9 shows a block diagram of a feedback control system for a voltage regulator in accordance with some embodiments.

In some embodiments, the feedback system can include a plurality of feedback systems. FIG. 9 illustrates a hybrid regulator with a plurality of feedback systems in accordance with some embodiments. FIG. 9 includes the two-stage hybrid regulator as described in FIG. 3. FIG. 9 further includes a first feedback loop 928 and a second feedback loop 930. The first feedback loop 928 is configured to control the step-down regulator 312, and the second feedback loop 930 is configured to control the flying switched-inductor regulator 314.

The first feedback loop 928 and the second feedback loop 930 are configured to cooperate with one another so that the step-down regulator 312 can operate close to its high efficiency range. As discussed above, the efficiency of the SC regulator can be the highest when the output voltage $V_{OUT}$ is close to $$\frac{M}{N}V_{TMP} - V_{DELTA}.$$

Therefore, the first feedback loop 928 is configured to operate the step-down regulator 312 so that the output voltage $V_{OUT}$ is close to $$\frac{M}{N}V_{TMP} - V_{DELTA}.$$

At the same time, the second feedback loop 930 is configured to operate the flying switched-inductor regulator 314 so that the output voltage $V_{OUT}$ is close to the target voltage.

In some sense, the first feedback loop 928 is a slow loop that operates the SC regulator to operate at a high efficiency and the second feedback loop 930 is a fast loop that reacts quickly to load fluctuations so that $V_{OUT}$ stays close to $V_{REF}$.

The digital blocks 908 920 can be synthesized using hardware programming languages including Verilog, VHDL and Bluespec.

For example, suppose $V_{IN}$=3.7V; the target $V_{OUT}$ is 1V ($V_{REF}$ equals 1V); and the step-down regulator 312 is a 3:1 SC regulator. In this case, the SC regulator has a high efficiency when $V_{TMP}/V_{OUT}$ is close to 3. However, $V_{TMP}/V_{OUT}$ can be equal to 3 only in ideal conditions, and in non-ideal conditions, there is a small voltage drop $V_{DELTA}$ in $V_{OUT}$ voltage. As a result, the SC regulator has a high efficiency when $V_{OUT}$ is close to $V_{TMP}/3 - V_{DELTA}$.

To increase the efficiency of the step-down regulator 312, the first feedback system 928 can control the step-down regulator 312 to provide, as output voltage $V_{OUT}$ 304, a voltage close to $V_{TMP}/3 - V_{DELTA}$. To this end, the first feedback system 928 can use a comparator 910 that compares $V_{TMP}/3 - V_{DELTA}$ and $V_{OUT}$ and sends the comparison result to a digital block 908. The comparison result can include a binary signal, indicating whether $V_{OUT}$ is greater than $V_{TMP}/3 - V_{DELTA}$ or not. Subsequently, the digital block 908 of the first feedback system 928 can generate a signal 906 that controls the power switches of the SC regulator 914 so that $V_{OUT}$ is within a tolerable error range from $V_{TMP}/3 - V_{DELTA}$.

In some embodiments, the second feedback loop 930 can use the information about the step-down regulator 312 to control the flying switched-inductor regulator 314. For example, assuming that $V_{DELTA}$ is 0.1V, $V_{TMP}$ can be 3.3V so that $V_{OUT}$ is close to the target value of 1V. Thus, the second feedback system 930 can set $V_{TMP}$ to 3.3V.

The second feedback system 928 can set $V_{TMP}$ as 3.3V using a comparator 926. The comparator 926 can compare $V_{REF}$ (1V) and $V_{OUT}$ and send a comparison result to the digital block 920. Subsequently, the digital block 920 can control the duty cycle of the flying switched-inductor regulator 314 so that $V_{OUT}$ is close to the desired value, in this case 1V. This feedback mechanism can automatically set $V_{TMP}$ close to 3.3V.

Using these two loops, the step-down regulator can operate at high efficiency by setting $V_{OUT}$ close to $V_{TMP}/3 - V_{DELTA}$ and the flying switched-inductor regulator 314 can set its duty cycle to generate the appropriate $V_{TMP}$ so that $V_{OUT}$ is close to the target value.

Figure 10:
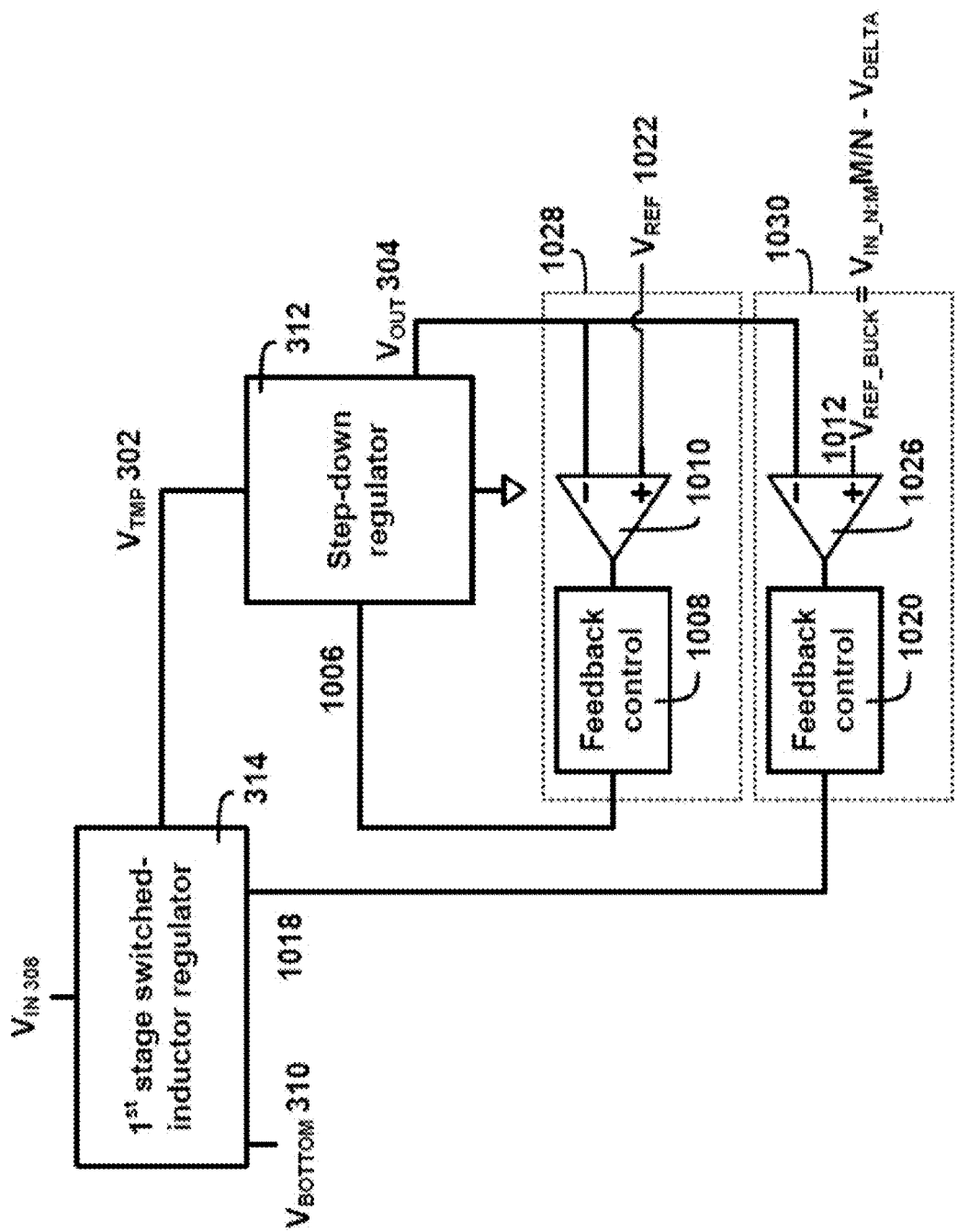
FIG. 10 shows a block diagram of a feedback control system for a voltage regulator in accordance with some embodiments.

FIG. 10 illustrates a hybrid regulator with a plurality of feedback systems having a different configuration in accordance with some embodiments. FIG. 10 includes a first feedback loop 1028 and a second feedback loop 1030. The first feedback loop 1028 is configured to control the step-down regulator 312, and the second feedback loop 1030 is configured to control the flying switched-inductor regulator 314.

The embodiment illustrated in FIG. 10 is substantially similar to the embodiment in FIG. 9. The difference is that the first feedback loop 1028 is a fast loop that reacts quickly to load fluctuations so that $V_{OUT}$ stays close to $V_{REF}$, whereas the second feedback loop 1030 a slow loop that operates the SC regulator to operate at a high efficiency.

In some embodiments, the digital blocks 908, 920, 1008, 1020 can be synthesized using hardware programming languages. The hardware programming languages can include Verilog, VHDL, Bluespec, or any other suitable hardware programming language. In other embodiments, the digital blocks 908, 920, 1008, 1020 can be manually designed and can be manually laid-out on a chip.

The hybrid regulator can use a feedback system in accordance with the embodiment of FIG. 9 or FIG. 10, depending on the maximum control bandwidth limited by their respective switching frequencies. When the maximum control bandwidth of the flying switched-inductor regulator 314 is higher than that of the step-down regulator 312, the feedback system in accordance with the embodiment of FIG. 9 can allow the hybrid regulator to have a higher loop bandwidth, thereby allowing the hybrid regulator to respond quickly to any fluctuations in the output voltage 304. When the maximum control bandwidth of the step-down regulator 312 is higher than that of the flying switched-inductor regulator 314, the feedback system of FIG. 10 allows the full system to have a higher loop bandwidth.

In some embodiment, the hybrid regulator can include a dead-zone feedback system that can address dead-zones of the flying switched-inductor regulator. For the sake of simplicity, the dead-zone feedback system is illustrated with respect to the hybrid regulator of FIG. 5, but this dead-zone feedback system can be used for any of the disclosed hybrid regulators.

A dead-zone of a flying switched-inductor regulator refers to a range of voltages that cannot be generated by the flying switched-inductor regulator. For example, in FIG. 5, the flying switched-inductor regulator should be able to generate all voltages between $V_{IN}$ 308 and $V_{BOTTOM}$ 310 by varying the duty cycle D between 0 and 1. However, due to efficiency reasons, the duty cycle D is often limited to 0.05 and 0.95. Thus, voltages between $V_{BOTTOM}$ and $V_{BOTTOM}+0.05$ ($V_{IN}-V_{BOTTOM}$), and voltages $V_{BOTTOM}+0.95$ ($V_{IN}-V_{BOTTOM}$) and $V_{IN}$ cannot be generated.

This dead-zone can potentially have an impact in the performance of the hybrid regulator because with the dead-zone, the hybrid regulator may not be able to generate all desired voltages within the range of interest. This issue is described below with an example.

Suppose $V_{IN}$ is 3.7V, which is a typical Li-Ion battery voltage; the target $V_{OUT}$ 504 is 1.15V; and the step-down regulator is a 3:1 SC regulator. Assuming the duty cycle of the flying switched-inductor regulator is D, $V_{TMP}=V_{IN}D+(V_{IN}-V_{OUT})(1-D)=V_{IN}-V_{OUT}(1-D)$. A 3:1 SC regulator may not have a conversion ratio that is exactly 3:1, but instead can have a slightly higher conversion ratio due to a slight voltage drop on $V_{OUT}$. Therefore, the conversion ratio of a 3:1 SC regulator is $3+N_{DELTA}$, where $N_{DELTA}$ is a number around 0.1. Since $V_{TMP}=(3+N_{DELTA})V_{OUT}$, combining with the equation above, $V_{IN}-V_{OUT}(1-D)=(3+N_{DELTA})V_{OUT}$, which leads to $V_{IN}=(4-D+N_{DELTA})V_{OUT}$, or $V_{IN}/(4-D+N_{DELTA})=V_{OUT}$. Since D is a number between 0 and 1, this regulator can set $V_{OUT}$ to values between $V_{IN}/(4+N_{DELTA})$ when D=0 and $V_{IN}/(3+N_{DELTA})$ when D=1. If the step-down regulator is, instead, a 4:1 SC regulator, this equation becomes $V_{IN}/(5-D+N_{DELTA})=V_{OUT}$, and regulator can set $V_{OUT}$ to values between $V_{IN}/(5+N_{DELTA})$ when D=0 and $V_{IN}/(4+N_{DELTA})$ when D=1.

Figure 11:
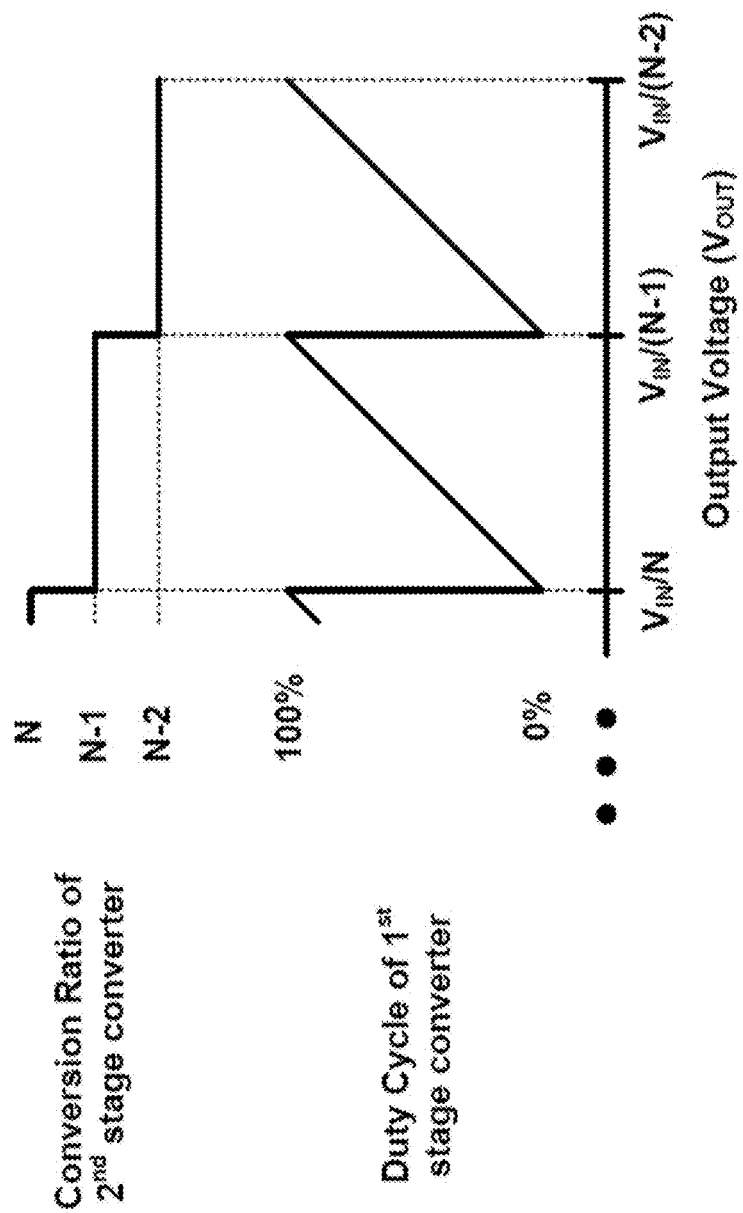
FIG. 11 illustrates how a duty cycle of a flying switched-inductor regulator and a conversion ratio of the step-down regulator change across output voltages in accordance with some embodiments.
Figure 12:
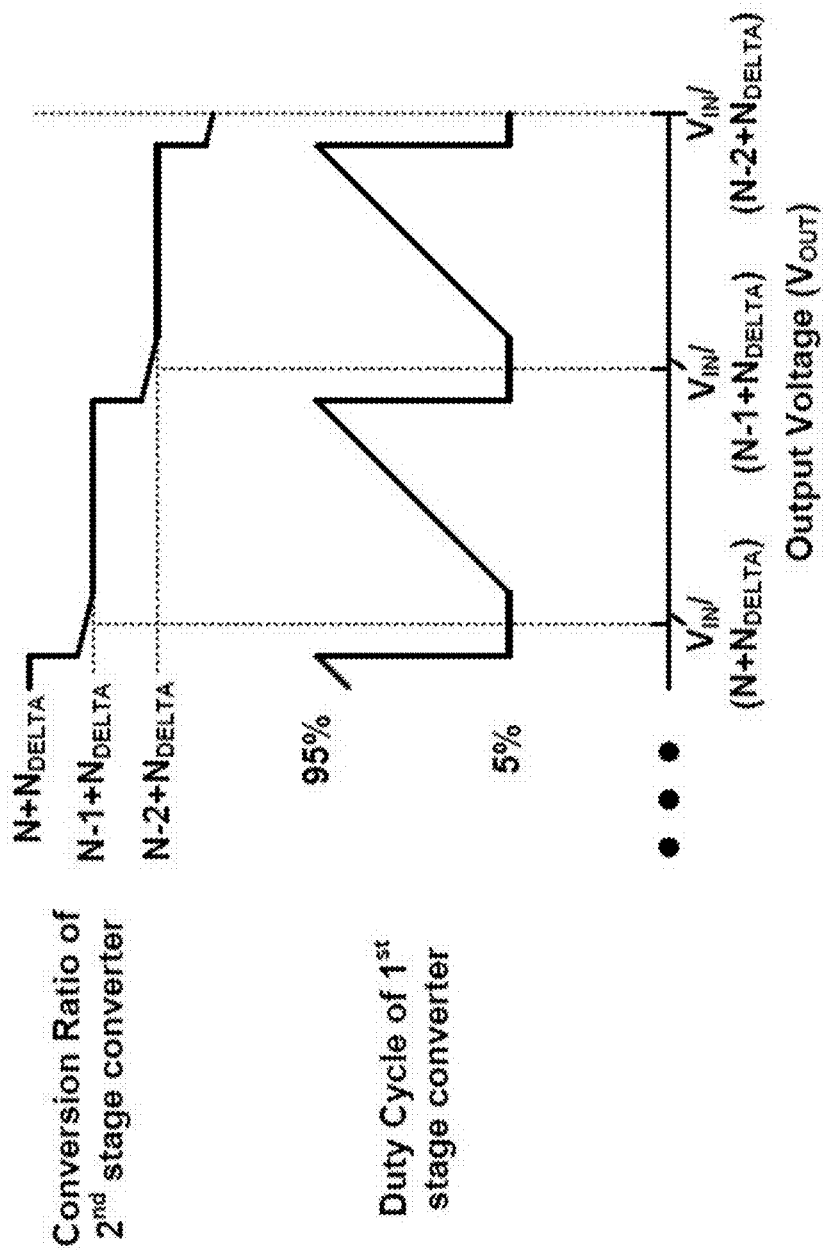
FIG. 12 illustrates how a duty cycle of the flying switched-inductor regulator and a conversion ratio of the step-down regulator changes across output voltages in accordance with some embodiments.

As described in FIG. 11, by changing the conversion ratio of the step-down regulator and the duty cycle of the flying switched-inductor regulator, this regulator can set $V_{OUT}$ to a wide range of voltages. However, in non-ideal cases, the flying switched-inductor regulator's duty cycle cannot be very high or very low, so a more realistic range would be something close to 0.05 to 0.95, instead of 0 to 1, as described in FIG. 12. Since the flying switched-inductor regulator's duty cycle has a dead-zone from 0 to 0.05, and from 0.95 to 1, there are some values to which $V_{OUT}$ cannot be set.

To overcome this problem, when it is desirable to operate the flying switched-inductor regulator 312 in the dead-zones, the step-down regulator 314 can perform the regulation by adjusting $N_{DELTA}$. For example, when the $2^{nd}$ stage is a 4:1 SC regulator, the regulator can set $V_{OUT}$ to values between $V_{IN}/4.95$ (D=0.05) and $V_{IN}/4.05$ (D=0.95). To set $V_{OUT}$ to values from $V_{IN}/5$ to $V_{IN}/4.95$, $N_{DELTA}$ can be somewhere between 0 and 0.05. To set $V_{OUT}$ to values from $V_{IN}/4.05$ to $V_{IN}/4$, the SC regulator should change to a 3:1 conversion ratio and set $N_{DELTA}$ to be somewhere between 0.05 and 0.1.

In some embodiments, the step-down regulator 314 can modify $N_{DELTA}$ by controlling the amount of voltage drop for the output voltage $V_{OUT}$ 304. The step-down regulator 314 can control the amount of voltage drop for the output voltage $V_{OUT}$ 304 using a programmable electrical component. In some embodiments, the programmable electrical component can include a programmable resistor bank. The step-down regulator 314 can provide a programmable resistor bank at the output node of the step-down regulator and control the resistance of the programmable resistor bank to control $N_{DELTA}$. One or more resistors in the resistor bank can be implemented using physical resistors, made from metal, poly-silicon or silicon layers. The silicon layers can include an N-type diffusion layer or a P-type diffusion layer. One or more resistors in the resistor bank can be implemented using transistors since they have a controllable resistance between source and drain terminals.

In other embodiments, the programmable electrical component for controlling the amount of voltage drop for the output voltage $V_{OUT}$ 304 can include a current source and a transistor. The current source can be configured to provide a predetermined amount of current to the transistor so that a predetermined voltage drop can be induced across the transistor.

In some embodiments, the current source in the programmable electrical component can be programmable. In some cases, the programmable current source can be implemented using a plurality of current source units. The programmable current source can be programmed to provide a predetermined amount of current by turning on a desired number of current sources while leaving the rest of them off. In some cases, a current source can be implemented using a transistor. For example, the gate voltage of the transistor can be controlled to adjust the amount of current flowing through the source and drain terminals. In some embodiments, the programmable current source can be implemented using a digital to analog converter (DAC).

In some embodiments, the transistor in the programmable electrical component can also be programmable. In particular, the transistor can be programmed to provide a desirable width and/or length. Such transistor can be referred to as a programmable transistor. The programmable transistor can be implemented using a plurality of transistor units having a predetermined width and/or length. For example, the programmable transistors can include a plurality of transistor units disposed in a parallel manner. The width and/or length of the programmable transistor can be controlled by turning on a desirable number of the transistor units while leaving the rest of them off.

In some embodiments, the hybrid converter can operate in a step-down configuration. For example, as illustrated in FIG. 3, the output voltage of the hybrid converter can be lower than the input voltage of the hybrid converter. In other embodiments, the hybrid converter can operate in a step-up configuration. The step-up configuration of the hybrid converter can be realized simply by swapping or flipping the output terminal and the input terminal of the hybrid converter.

Figure 13:
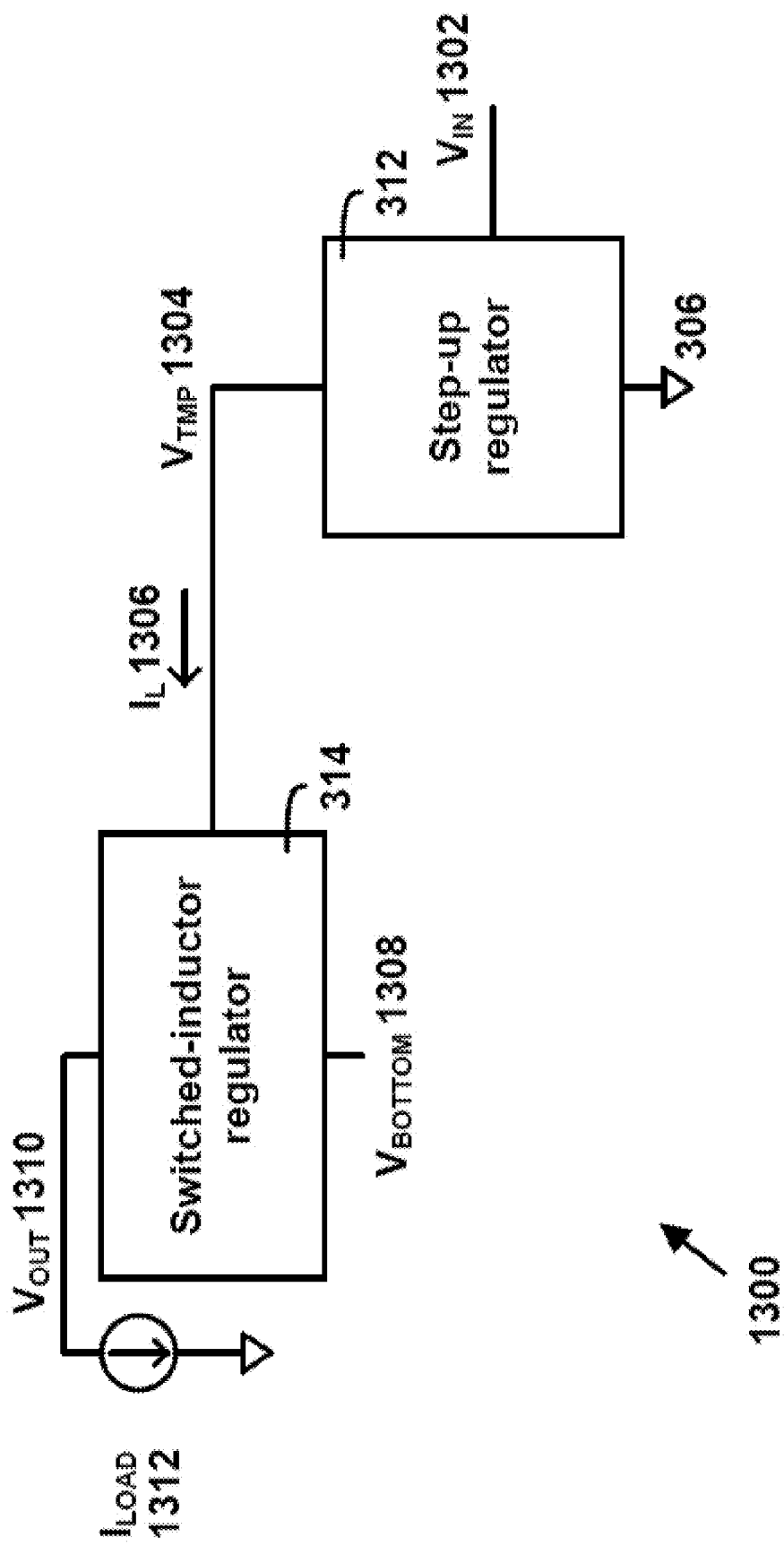
FIG. 13 illustrates a hybrid converter in a step-up configuration in accordance with some embodiments.

FIG. 13 illustrates a hybrid converter in a step-up configuration in accordance with some embodiments. The operation of the hybrid converter 1300 in a step-up configuration is similar to the operation of the hybrid converter 300 in a step-down configuration in FIG. 3, except that the location of $V_{IN}$ 308 and $V_{OUT}$ 304 are swapped and $V_{IN}$ 1302 is lower than $V_{OUT}$ 1310.

For example, the hybrid converter 1300 is configured to receive an input voltage $V_{IN}$ 1302 at an output node of the step-down regulator 312. Because the input node and the output node of the step-down regulator 312 has been flipped in this configuration, the step-down regulator 312 is in effect operating as a step-up regulator. Therefore, the step-down regulator 312 is configured to provide a stepped-up voltage signal $V_{TMP}$ 1304 and a current $I_L$ 1306. The flying switched-inductor regulator 314 can receive, at its output, the stepped-up voltage signal $V_{TMP}$ 1304 and the current $I_L$ 1306, and provide a stepped-up output voltage $V_{OUT}$ 1310, as a function of the bottom voltage $V_{BOTTOM}$ 1308, and the output current $I_{LOAD}$ 1312.

Figure 14A:
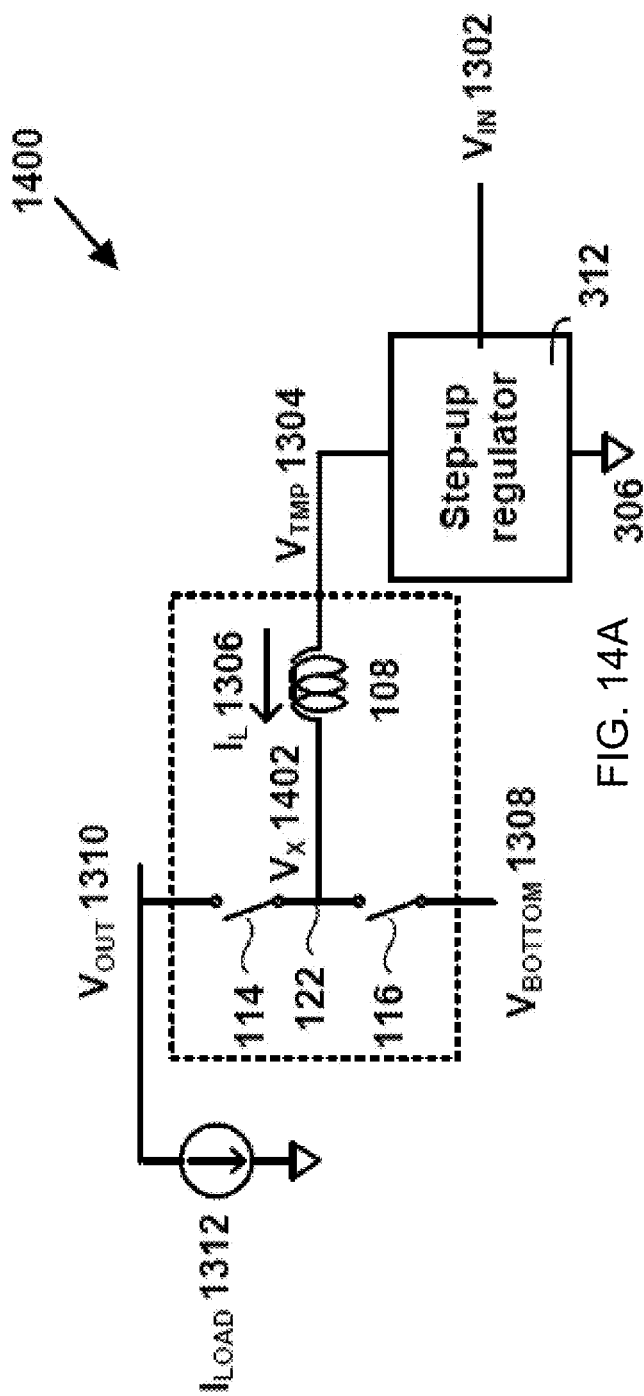
FIGS. 14A-14B illustrate an operation of a hybrid converter in a step-up configuration in accordance with some embodiments.
Figure 14B:
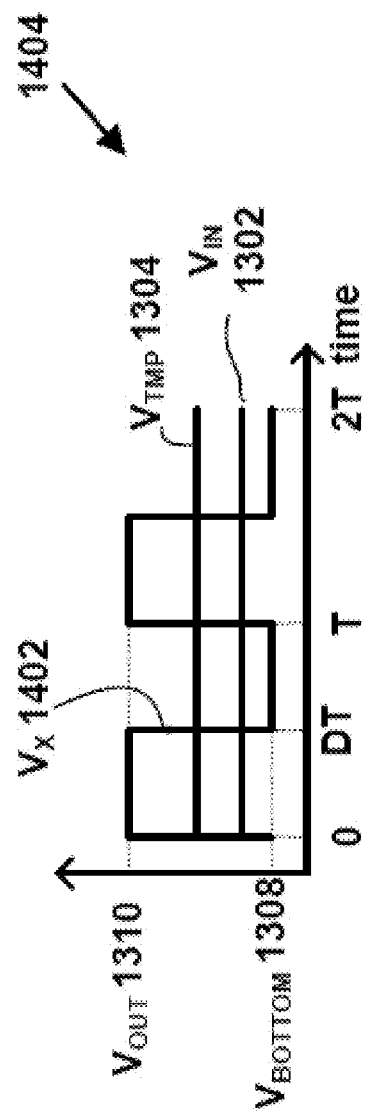

FIGS. 14A-14B illustrate an operation of a hybrid converter in a step-up configuration in accordance with some embodiments. FIG. 14A illustrates a scenario in which the flying switched-inductor regulator 314 in the hybrid regulator 1400 is a flying buck regulator. In this case, the intermediate voltage $V_X$ 1402 alternates between the output voltage $V_{OUT}$ 1310 and the bottom voltage $V_{BOTTOM}$ 1308, depending on which one of the switches 114, 116 is turned on. In some embodiments, the control signals for controlling the components in FIG. 14A can be substantially similar to the control signals for controlling the components in FIG. 4. As illustrated in the timing diagram 1404 of FIG. 14B, because the hybrid converter is in a step-up configuration, the output voltage $V_{OUT}$ 1310 is higher than the input voltage $V_{IN}$ 1302.

In some embodiments, the hybrid converters 1300, 1400 can be used in conjunction with a level shifting regulator in a manner substantially similar to how the hybrid converters 300, 400 can be used in conjunction with the level shifting regulator 520, as illustrated in FIGS. 5A-5C. In some embodiments, the hybrid converters 1300, 1400 can be used in conjunction with one or more feedback control loops in a manner substantially similar to how the hybrid converters 300, 400 can be used in conjunction with one or more feedback control loops 928, 930, 1028, 1030, as illustrated in FIGS. 9-10. In some cases, the one or more feedback control loops can also implement the dead-zone aware control mechanism, as illustrated in conjunction with FIGS. 11-12.

Figure 15A:
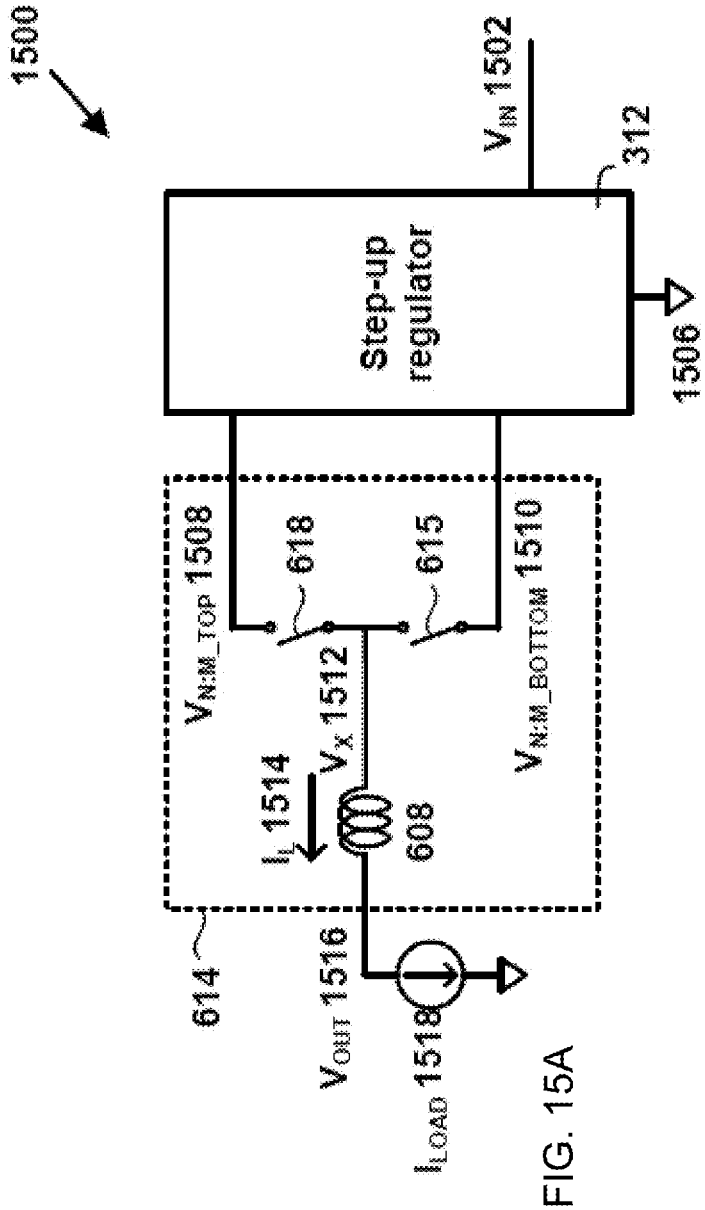
FIGS. 15A-15B illustrate a hybrid converter including a flying switched-inductor regulator in a step-up configuration in accordance with some embodiments.
Figure 15B:
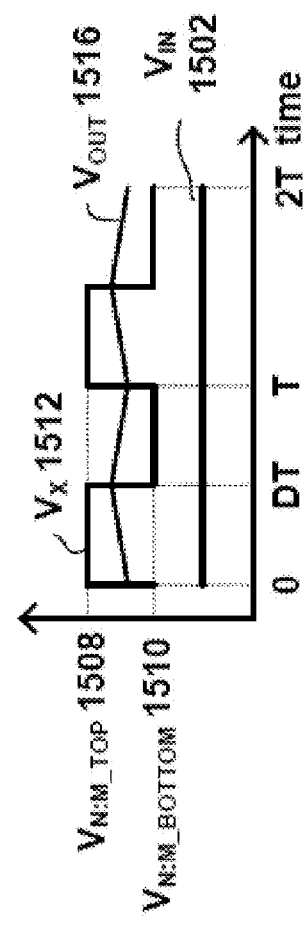

In some embodiments, a hybrid converter including a flying switched-inductor regulator can also be configured in a step-up configuration. FIGS. 15A-15B illustrate a hybrid converter including a flying switched-inductor regulator in a step-up configuration in accordance with some embodiments. The operation of the hybrid converter 1500 in a step-up configuration is similar to the operation of the hybrid converter 500 in a step-down configuration in FIG. 5, except that the location of $V_{IN}$ 1502 and $V_{OUT}$ 1516 are swapped and $V_{IN}$ 1502 is lower than $V_{OUT}$ 1516.

For example, the hybrid converter 1500 is configured to receive an input voltage $V_{IN}$ 1502 at an output node of the step-down regulator 312. Because the input node and the output node of the step-down regulator 312 has been flipped in this configuration, the step-down regulator 312 is in effect operating as a step-up regulator. When the step-down regulator 312 has multiple input voltage terminals, each terminal is configured to receive a voltage signal that is stepped down by a different ratio, and the step-down regulator 312 is configured to provide two or more stepped-up voltage signals $V_{N:M\_TOP}$ 1508 and $V_{N:M\_BOTTOM}$ 1510.

The two or more stepped-up voltage signals 1508, 1510 can be provided to two or more switches 615, 618 in the flying switched-inductor regulator 614 so that the two or more switches 615, 618 can provide one of the two or more stepped-up voltage signals 1508, 1510 to an inductor 608 in a time-multiplexed manner. This generates an intermediate voltage $V_X$ 1512 and a load current $I_L$ 1514 at a first node of the inductor 608. The inductor can smooth out the intermediate voltage $V_X$ 1512 to provide an output voltage $V_{OUT}$ 1516 and an output current $I_{OUT}$ 1518. FIG. 15B shows a timing diagram of the two or more stepped-up voltage signals 1508, 1510, the intermediate voltage $V_X$ 1512, and the output voltage $V_{OUT}$ 1516.

Figure 16A:
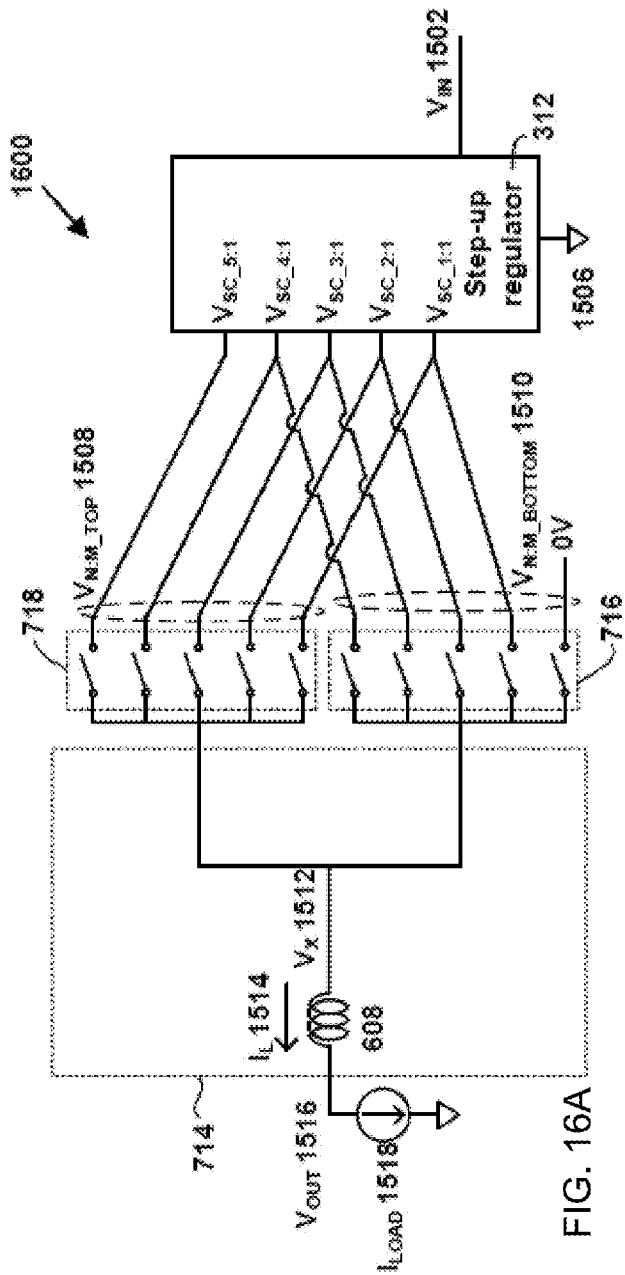
FIGS. 16A-16B illustrate an operation of a hybrid regulator having a flying switched-inductor regulator in accordance with some embodiments.
Figure 16B:
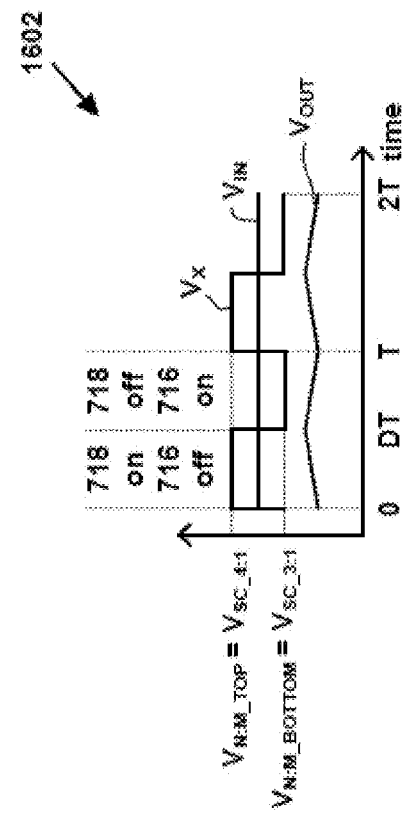

FIGS. 16A-16B illustrate an operation of a hybrid regulator having a flying switched-inductor regulator in accordance with some embodiments. FIG. 16A illustrates a scenario in the hybrid regulator 1500 includes a flying switched-inductor regulator 714 having an inductor 608. In this case, the control signals for controlling the components in FIG. 16A can be substantially similar to the control signals for controlling the components in FIG. 7. As illustrated in the timing diagram 1602 of FIG. 16B, because the hybrid converter 1500 is in a step-up configuration, the output voltage $V_{OUT}$ 1516 is higher than the input voltage $V_{IN}$ 1502.

In some embodiments, the hybrid converters 1300, 1400, 1500, 1600 in a step-up configuration can be used in various applications. In a mobile handheld device, the input voltage 1302, 1502 can be a Lithium-Ion (Li-Ion) battery providing a voltage signal within a 2.8-4.3V voltage range, and the load $I_{LOAD}$ 706 can be used to drive one or more of a display backlight, a camera flash, and one or more Organic Light Emitting Diode (OLED) displays. Some of these loads may use a voltage that is higher than the Li-Ion battery voltage. Therefore, the hybrid converters 1300, 1400, 1500, 1600 in a step-up configuration can be useful in providing voltage and current signals for some of these loads.

Figure 17:
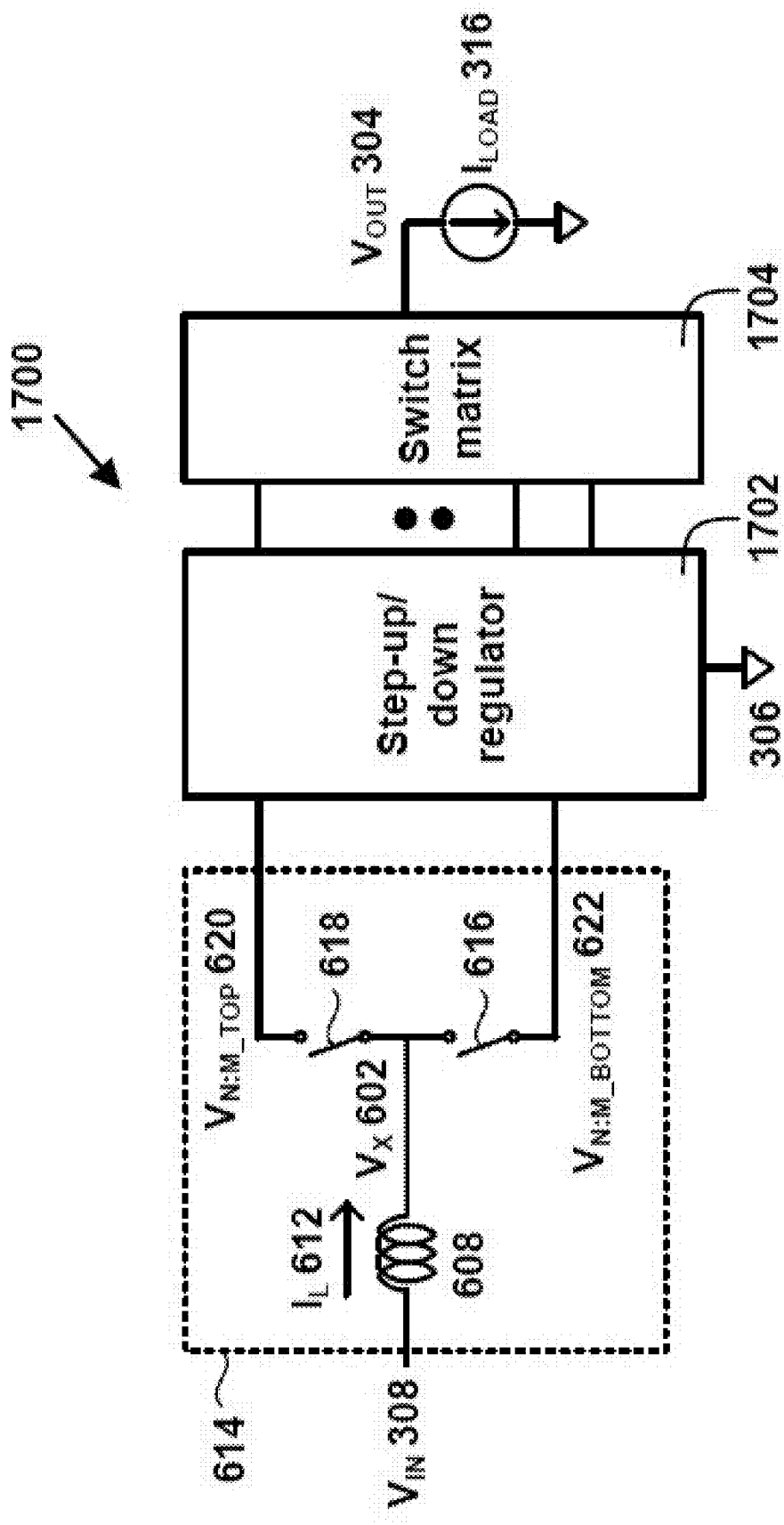
FIG. 17 shows a hybrid converter that can provide both step-down and step-up voltage regulation in accordance with some embodiments.

In some embodiments, a hybrid converter can be configured in a step-down or a step-up configuration without having to flip the input voltage terminal and an output voltage terminal. FIG. 17 shows a hybrid converter that can provide both step-down and step-up voltage regulation in accordance with some embodiments. The hybrid converter 1700 is similar to the hybrid converter 600. The difference between the hybrid converter 1700 and the hybrid converter 600 is that the hybrid converter 1700 includes a step-down/up converter 1702 that is capable of providing both step-up and step-down regulation of voltage signals. The step-down/up converter 1702 can include a plurality of output terminals that can each provide an output voltage signal that is lower or higher than $V_{IN}$ 308. The switch matrix 1704 coupled to the step-down/up converter 1702 can operate as a multiplexer that is configured to select one of the plurality of output terminals to be coupled to the load of the hybrid converter 1700, thereby providing the final output voltage, $V_{OUT}$ 304. Therefore, the final output voltage $V_{OUT}$ 304 can be lower (step-down) or higher (step-up) than the input voltage $V_{IN}$ 308, depending on the configuration of the switches 1704.

In some embodiments, the step-down/up converter 1702 can include one or more switched capacitor regulators that are configured to provide a distinct voltage gain setting. The one or more switched capacitor regulators can be configured to provide a predetermined increase (or gain) or a predetermined decrease (or reduction) of voltage in a voltage signal received by the one or more switched capacitor regulators. Therefore, the step-down/up converter 1702 can be configured to accommodate one or more distinct voltage gain settings.

In some embodiments, input terminals of the one or more switched capacitor regulators in the step-down/up converter 1702 can be coupled to the inductor 608 using a dedicated set of switches. For example, input terminals of the one or more switched capacitor regulators in the step-down/up converter 1702 can be coupled to the inductor 608 using a plurality of switches 716, 718 as illustrated in FIG. 7A.

In some embodiments, the hybrid converter 1700 can be used in conjunction with a level shifting regulator in a manner substantially similar to how the hybrid converters 300, 400 can be used in conjunction with the level shifting regulator 520, as illustrated in FIGS. 5A-5C. In some embodiments, the hybrid converter 1700 can be used in conjunction with one or more feedback control loops in a manner substantially similar to how the hybrid converters 300, 400 can be used in conjunction with one or more feedback control loops 928, 930, 1028, 1030, as illustrated in FIGS. 9-10. In some cases, the one or more feedback control loops can also implement the dead-zone aware control mechanism, as illustrated in conjunction with FIGS. 11-12.

In some embodiments, the hybrid converter 1700 can be operated in a reverse configuration (e.g., the input terminal and the output terminal of the hybrid converter 1700 are switched.) The operational direction of the hybrid converter 1700 can be flexibly modified to accommodate various types of input voltage sources and output loads coupled to the input terminal and the output terminal of the hybrid converter 1700.

Various embodiments of the disclosed hybrid converters can be used as a battery charger in a battery-operated device. For example, an output node of a hybrid converter can be coupled to a battery so that the output voltage and the output current of the hybrid converter are used to charge the battery. The hybrid converter can be particularly useful in charging batteries in a handheld device. A handheld device, such as a smartphone, can use a Lithium-Ion (Li-Ion) battery that is configured to provide a voltage output within the range of approximately 2.8-4.3V, depending on whether the battery is charged or not (e.g., 4.3V when fully charged, 2.8V when fully discharged). The Li Ion battery in the handheld device can be charged using a Universal Serial Bus (USB). The current version of the USB power line uses 5V (and the future versions of the USB may use even higher voltages), which is higher than the voltage output of the Li Ion battery. Therefore, the voltage from the USB power line should be stepped down before it can be used to charge the Li Ion battery. To this end, the hybrid converter can be configured to receive the power line voltage and current from the USB and provide a step-down version of the power line voltage and current to the Li-Ion battery so that the Li-Ion battery can be charged based on the voltage and current from the USB.

In some embodiments, the above-identified configuration, in which a battery is charged using a USB power line, can be used in reverse as a USB On-The-Go (OTG), where the battery in a first device can deliver power to a second device over USB to charge the second device. In this scenario, a battery in a first device is configured to deliver current to a battery in a second device through a USB. Although the output voltage of the battery in the first device may be lower than the USB power line voltage, the hybrid converter can operate in a step-up configuration to step-up the output voltage of the battery to that of the USB power line. This way, the battery in the first device can charge the battery in the second device over the USB power line.

In some cases, a hybrid regulator can achieve a high performance in terms of, for example, the power conversion efficiency, the power density, and the control loop bandwidth, by using appropriate fabrication processes and integration methods.

In some embodiments, an appropriate fabrication process technology can improve the quality of passive components in the hybrid regulator. In particular, an appropriate fabrication process technology can increase the capacitance density of capacitors and also reduce the parasitic capacitance of capacitors in the hybrid regulator. Also, an appropriate fabrication process technology can allow for a fabrication of an inductor using thick metals with very low parasitic resistance. Both high capacitance density capacitors and low resistance inductors can improve the power density (e.g., the power transfer capability) and power transfer efficiency of IVRs.

In some embodiments, one or more blocks of a hybrid regulator can be implemented in a DRAM process that allows for a fabrication of high-density capacitors that are often used in DRAM cells. A hybrid regulator can also utilize ultra-thick metals, having a thickness in the range of about 3-10 μm, with low sheet resistance to implement high-quality, on-chip spiral inductors.

In some cases, the performance of a hybrid regulator can depend on how it is integrated with other chips or systems. For example, the implementation of passive components, including inductors and capacitors, and power distribution network (e.g., power grid) can be subject to a trade-off between the quality of the passive components (e.g., capacitance density of capacitors and the parasitic resistance of inductors) and the size of the IVR chip, the circuit board embodying the IVR chip, and/or the electronic system embodying the IVR chip. For example, the full integration of passive components can allow for an IVR system having a small form factor (e.g., a small size), but at the cost of lower quality passive components compared with the passive components in an on-package IVR system or the passive components embodied as an off-chip component.

Figure 18:
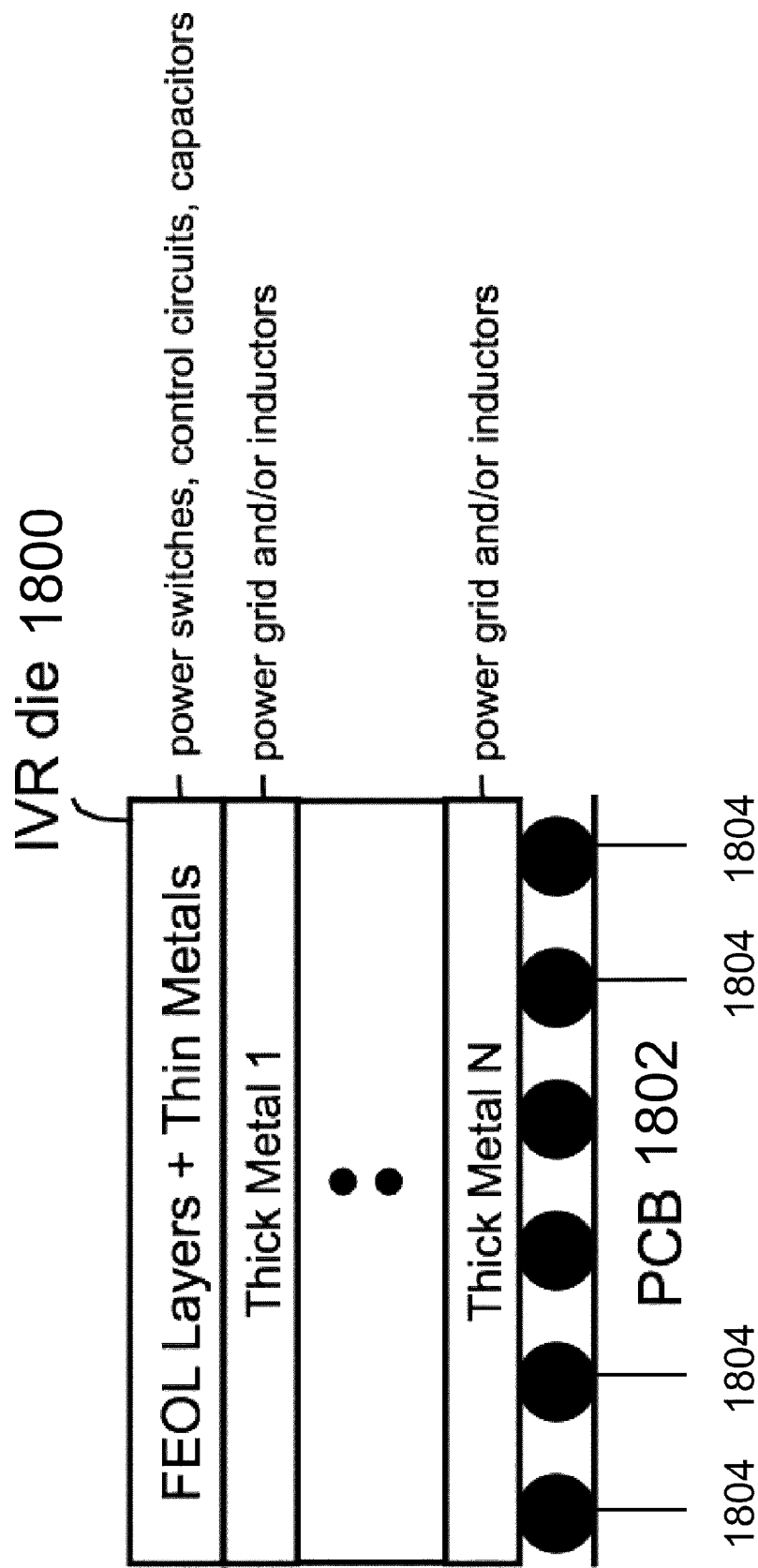
FIG. 18 is a cross-section view of an integrated voltage regulator in accordance with some embodiments.

In some embodiment, a hybrid regulator can be implemented as an integrated regulator in which all components are integrated on a single die. FIG. 18 illustrates an integrated regulator in accordance with some embodiments. The die 1800 can include switches, feedback control circuitries, and capacitors in the upper metal layers of the die 1800, including the front-end-of-line (FEOL) layers and thin metal layers, while the die 1800 can include one or more inductors in the lower metal layers that can accommodate thicker metals. The FEOL layers include one of the bottom layers in an integrated-chip (IC) where the individual active and passive devices (transistors, capacitors, resistors, etc.) are patterned. FIG. 18 illustrates a flip-chip packaging implementation in which the die 1800 is flipped for a flip-chip package. However, the die 1800 can be packaged in an up-right package as well. The die 1800 can be coupled to the printed circuit board (PCB) via solders 1804. The upper layers can be coupled to the lower layers through a set of interconnects such as vias and metals.

Figure 19:
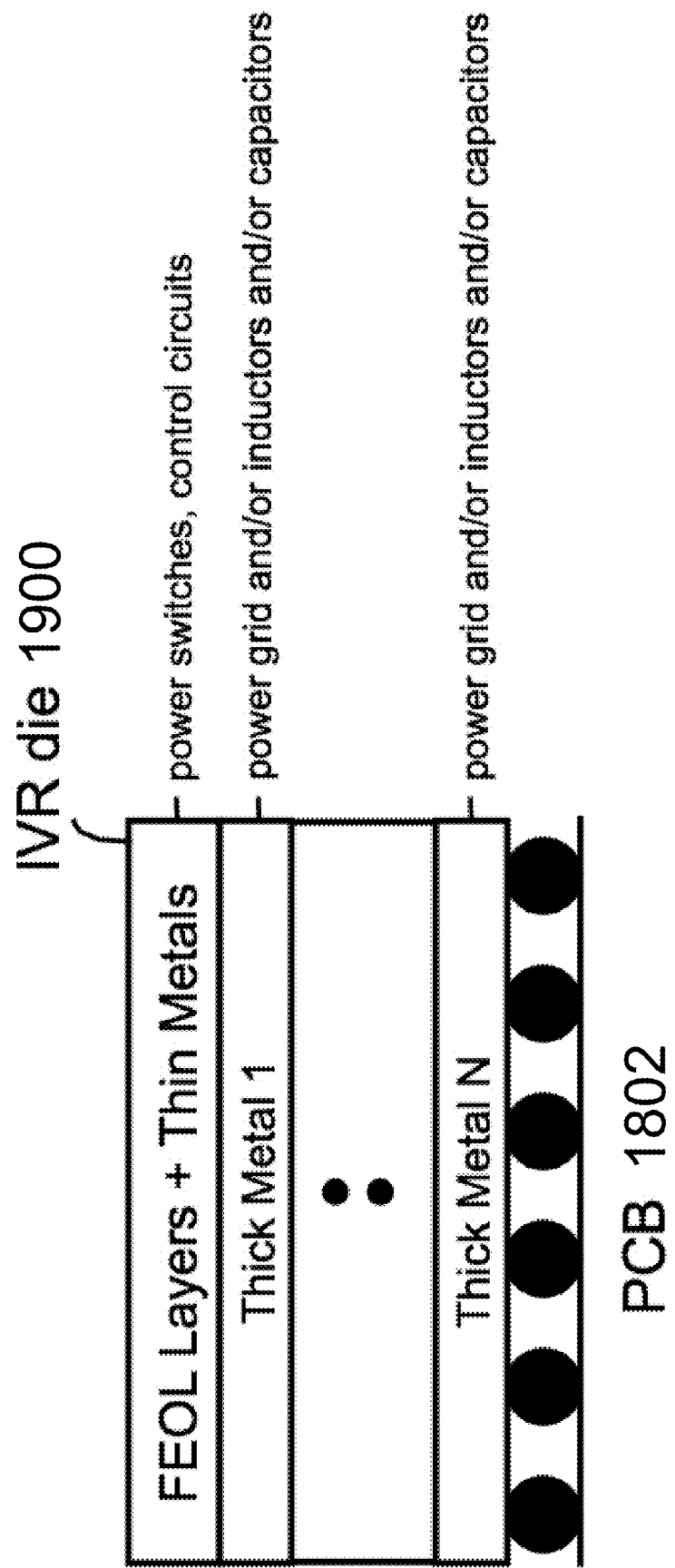
FIG. 19 is a cross-section view of an integrated voltage regulator in accordance with some embodiments.

In some embodiment, a hybrid regulator can be implemented as an integrated regulator in which all components are integrated on a single die, but in a different configuration compared to FIG. 18. FIG. 19 illustrates an integrated regulator in accordance with some embodiments. The die 1900 can include switches and feedback control circuitries in the upper metal layers, including the front end of line layers and thin metal layers, while the die 1900 can include capacitors and inductors in the lower metal layers with thicker metals and materials necessary for denser capacitors. The upper layers can be coupled to the lower layers through a set of interconnects such as vias and metals.

Figure 20:
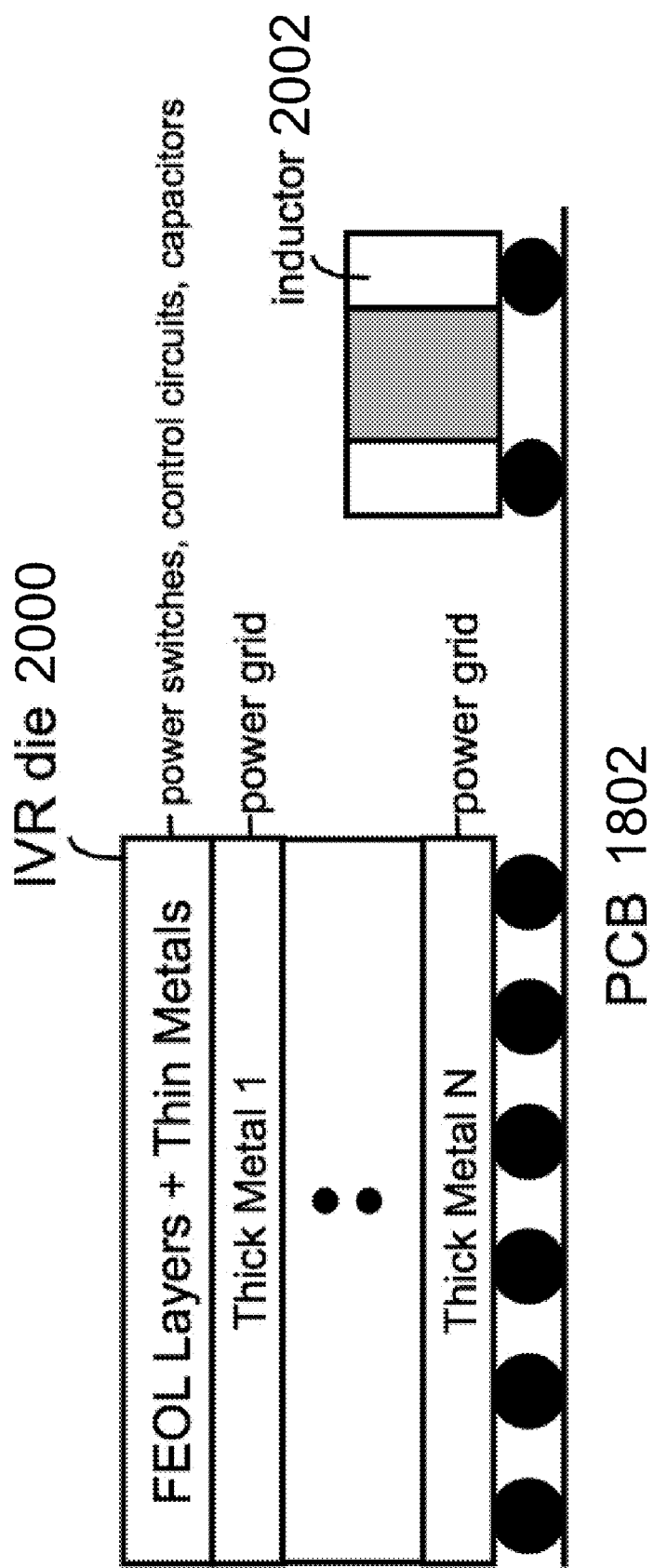
FIG. 20 is a cross-section view of an integrated voltage regulator with a discrete inductor component in accordance with some embodiments.

In some embodiment, portions of a hybrid regulator can be implemented on a single die while one or more inductors are implemented as discrete components, as illustrated in FIG. 20 in accordance with some embodiments. For example, the die 2000 includes power switches, feedback control circuitries and capacitors in the upper layers, while inductors 2002 are implemented as discrete components. The inductor can include a 0201, 0402, 0308, 0805 discrete inductor.

Figure 21:
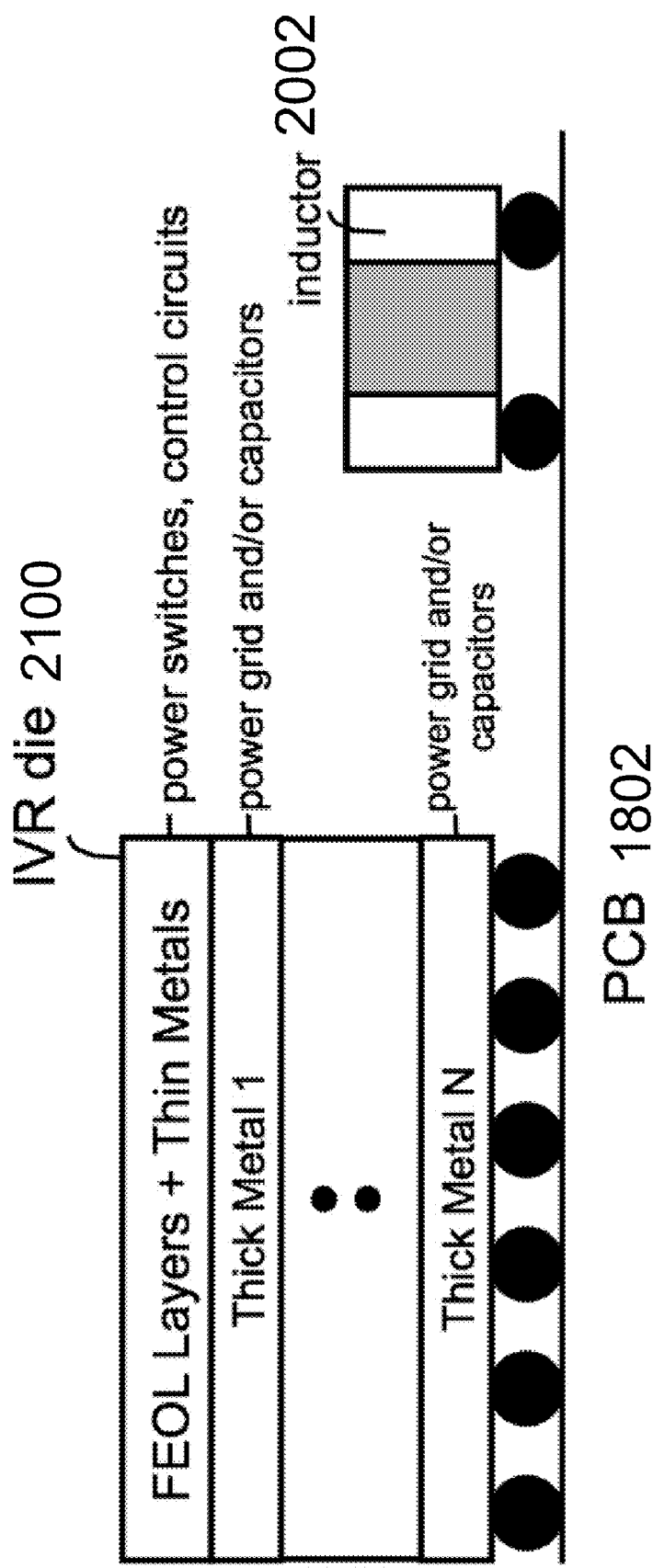
FIG. 21 is a cross-section view of an integrated voltage regulator with a discrete inductor component in accordance with some embodiments.

In some embodiment, portions of a hybrid regulator can be implemented on a single die while one or more inductors are implemented as discrete components, as illustrated in FIG. 21 in accordance with some embodiments. The die 2100 includes switches and feedback control circuitries in the upper layers, including the front end of line layers and thin metal layers, while the die 2100 includes capacitors in the lower layers with materials necessary for denser capacitors. The upper layers can be coupled to the lower layers through a set of interconnects such as vias and metals.

Figure 22:
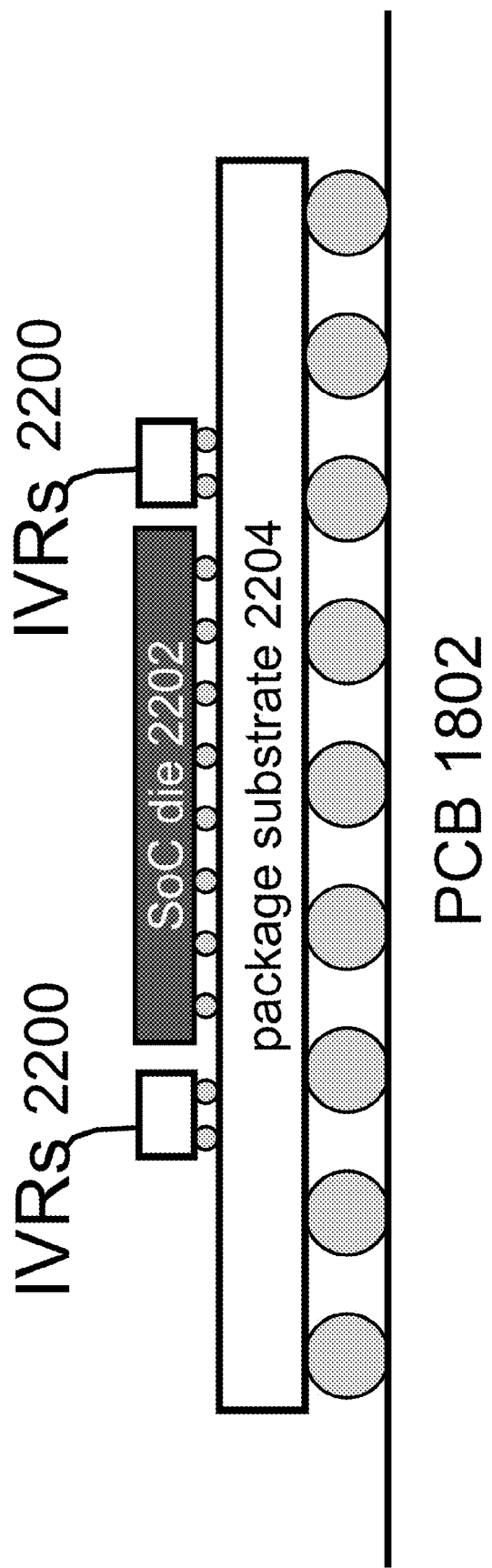
FIG. 22 is a cross-section view of integrated voltage regulator dies placed next to an system-on-chip (SoC) die in an SoC package in accordance with some embodiments.

In some embodiments, as illustrated in FIG. 22, one or more integrated voltage regulator dies 2200, including power switches, feedback control circuitries, capacitors and inductors, can be placed side-by-side next to another system-on-chip (SoC) die 2202 on an SoC package substrate 2204.

Figure 23:
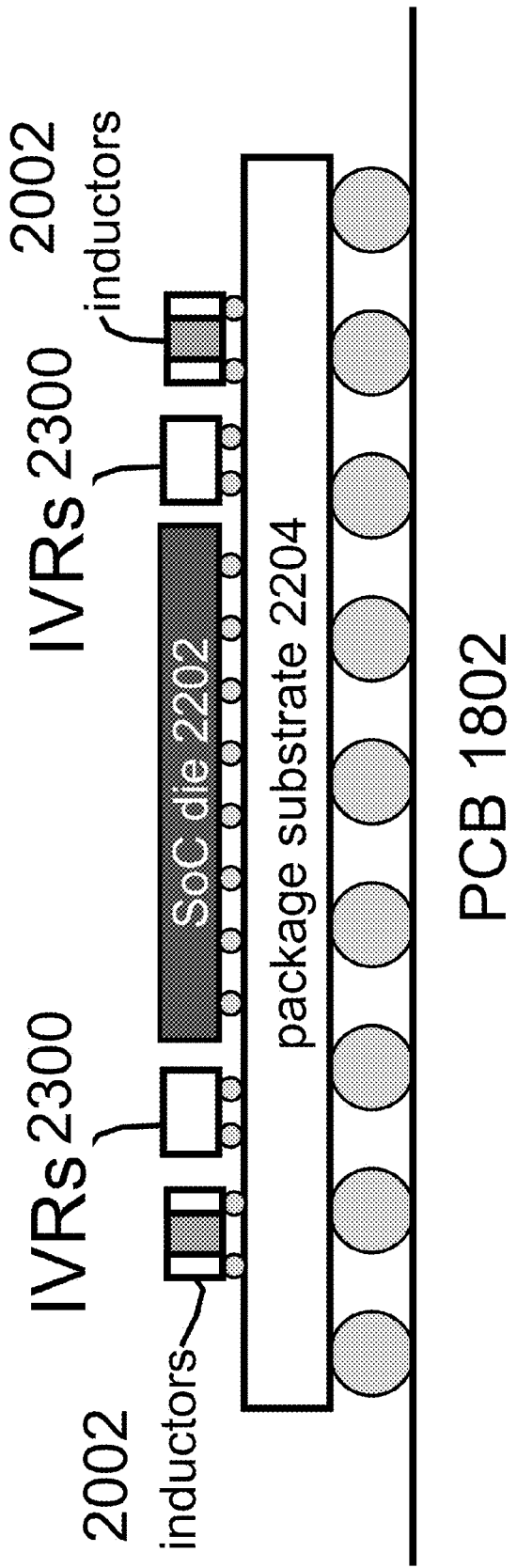
FIG. 23 is a cross-section view of integrated voltage regulator dies and discrete inductor components placed next to an SoC die in an SoC package in accordance with some embodiments.

In some embodiments, as illustrated in FIG. 23, one or more integrated voltage regulator dies 2300, including power switches, feedback control circuitries, capacitors, can be placed side-by-side next to another SoC die 2202 on an SoC package substrate 2204, along with discrete inductor components 2002. The inductors 2002 can include 0201, 0402, 0308, 0805 discrete inductors.

Figure 24:
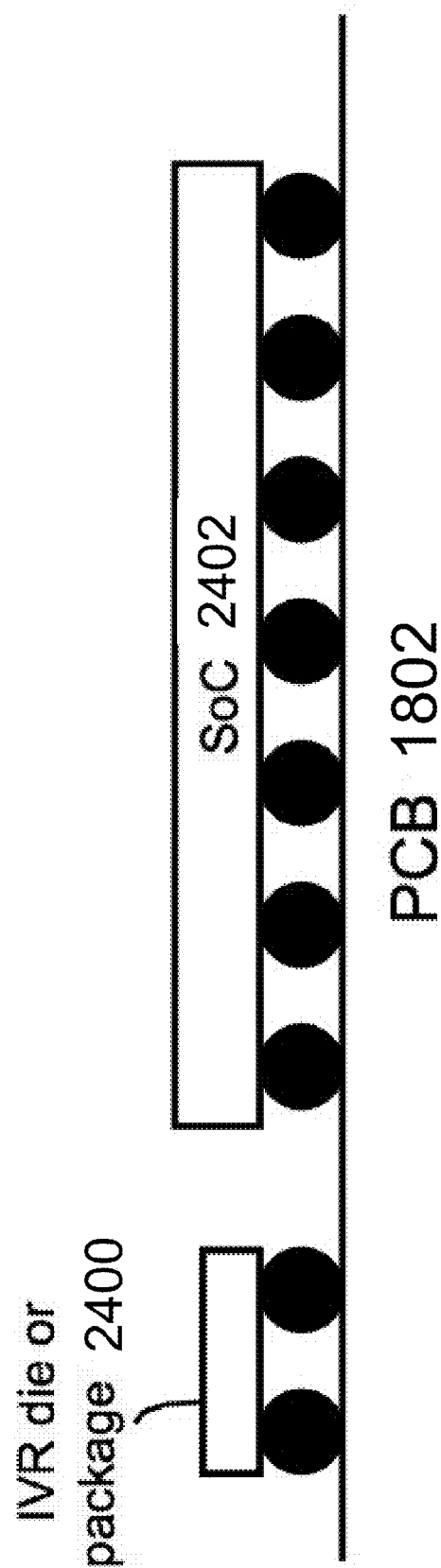
FIG. 24 is a cross-section view of an integrated voltage regulator die or package placed next to an SoC package on a printed circuit board (PCB) in accordance with some embodiments.

In some embodiments, as illustrated in FIG. 24, one or more integrated voltage regulator dies or packages 2400, including power switches, feedback control circuitries, capacitors and inductors, are placed side-by-side next to another SoC 2402 on a PCB 1802.

Figure 25:
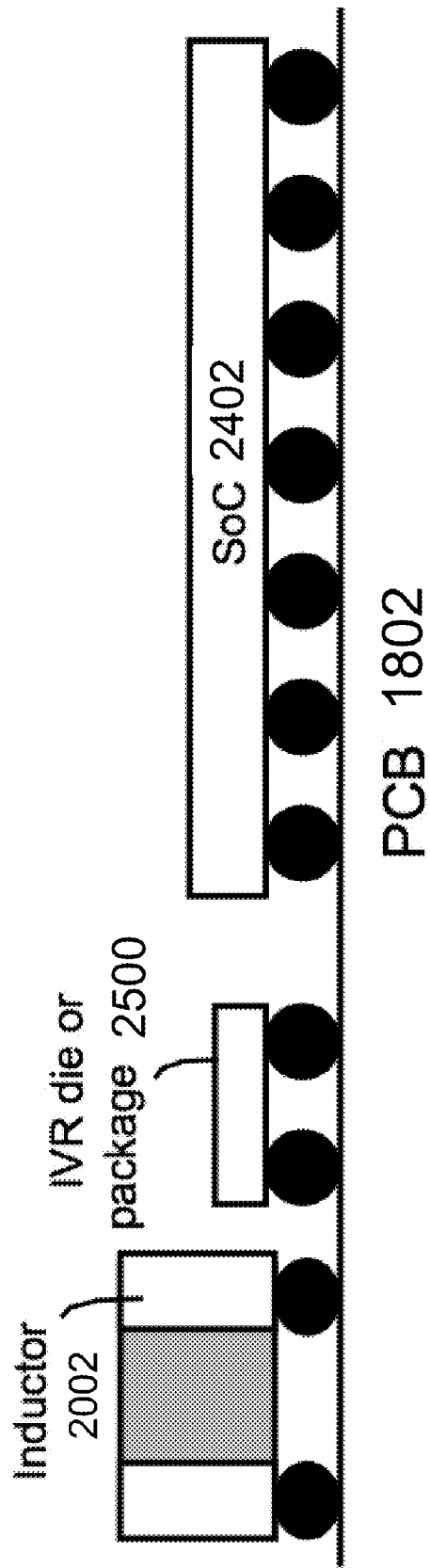
FIG. 25 is a cross-section view of an integrated voltage regulator die or package and discrete inductor component placed next to an SoC package on a PCB in accordance with some embodiments.

In some embodiments, as illustrated in FIG. 25, one or more integrated voltage regulator dies or packages 2500 containing power switches, feedback control circuitries, capacitors are placed side-by-side next to another SoC 2402 on a PCB 1802 along with discrete inductor 2002 components. The inductors 2002 can be 0201, 0402, 0308, 0805 discrete inductors.

Figure 26:
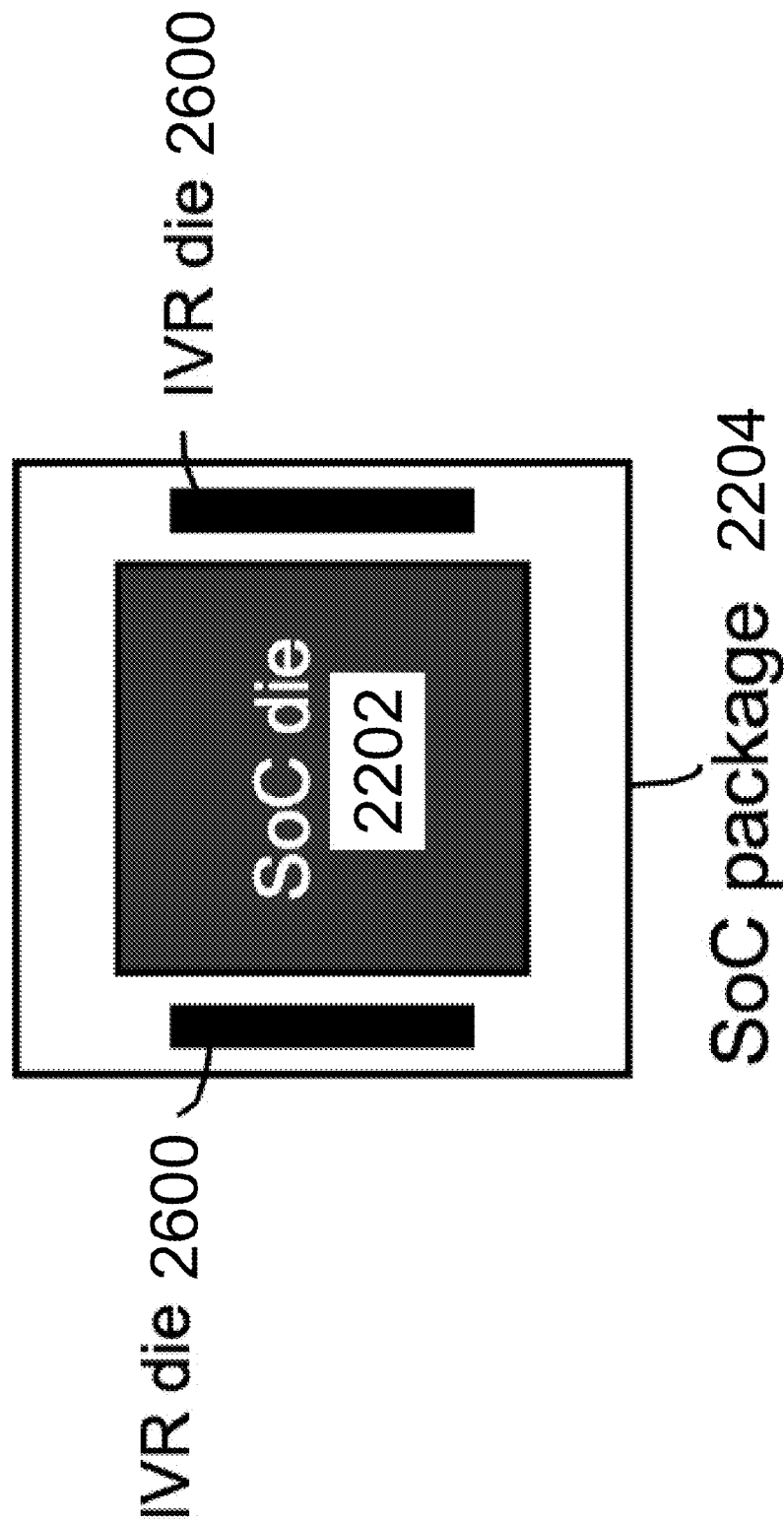
FIG. 26 is a top view of large numbers of small integrated voltage regulator dies placed next to an SoC package on a PCB in accordance with some embodiments.

In some embodiments, as illustrated in FIG. 26, few, large IVR dies 2600 can be placed next to another SoC die 2202 in an SoC package 2204.

Figure 27:
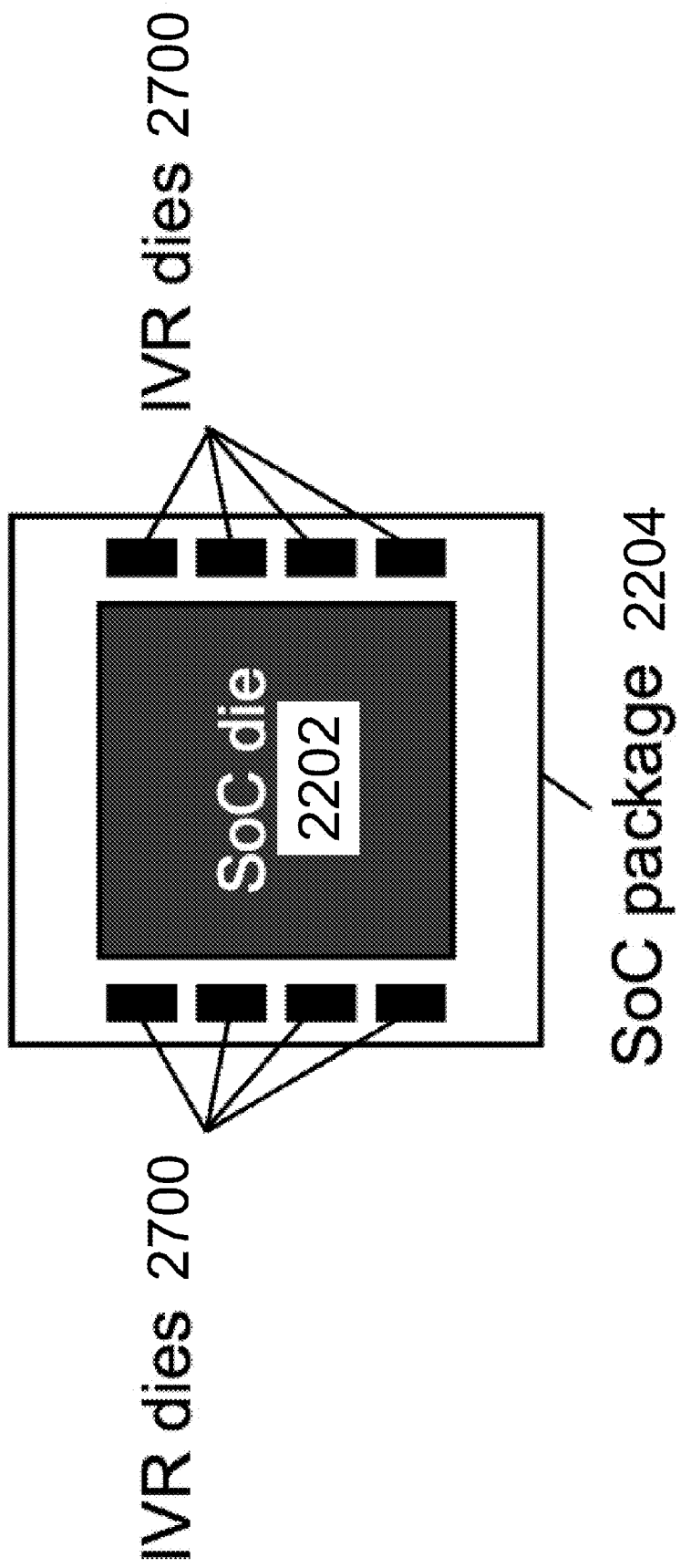
FIG. 27 is a top view of few, large integrated voltage regulator dies placed next to an SoC package on a PCB in accordance with some embodiments.

In some embodiments, as illustrated in FIG. 27, large number of small "integrated voltage regulator" dies 2700 surround another SoC die 2202 in an SoC package 2204.

In some embodiments, a die, illustrated in FIGS. 18-27, can be packaged in a through-hole package. The through-hole package can include a single in-line package, a dual in-line package (DIP), a ceramic DIP, a glass sealed ceramic DIP, a quadruple in-line package, a skinny DIP, a zig-zag in-line package, a molded DIP, or a plastic DIP. In some embodiments, the die can be packaged as a surface mount. The surface mount can include a ceramic column grid array (CGA), a column grid array, a ceramic package, a land grid array (LGA), and a multi-chip module (MCM). In some embodiments, the die can be packaged in a chip carrier. A chip carrier can include a rectangular package with electric contacts on all four edges of the package. The chip carrier can include a bump chip carrier (BCC), a ceramic leadless chip carrier (CLCC), a dual lead-less chip carrier (DLCC), and a plastic leaded chip carrier (PLCC). In some embodiments, the die can be packaged in using pin grid arrays. The pin grid arrays can include an organic pin grid array (OPGA), a flip-chip pin grid array (FCPGA), a pin array cartridge (PAC), a pin grid array (PGA), and a ceramic pin grid array (CPGA). In some embodiments, the die can be packaged in using ball grid arrays. A ball grid array can include a fine pitch ball grid array (FBGA), a ceramic ball grid array (CBGA), a plastic ball grid array (PBGA), and a thin ball grid array (TBGA).

When a hybrid regulator is initially powered up, the signals in the hybrid regulator are ramped to a stable state. The transient state between the off state, when all inputs and outputs are grounded, and the on state, when the input voltage and output voltage have all reached their respective stable states, is referred to as a start-up. In some embodiments, the input voltage from the power source, such as a battery, and the regulated output voltage of the hybrid regulator can start-up together (or ramp up together). In other words, in those embodiments, the input voltage from the power source can be controlled so that it is ramped up together with the regulated output voltage. To this end, the hybrid regulator can use a simple start-up circuitry to allow for a smooth start-up. In particular, the start-up circuitry can maintain a constant ratio of input voltage and the output voltage so that the input power source can smoothly charge up the output voltage, without causing any sudden voltage instabilities.

In other embodiments, the input power source may not be controlled. Instead, the input power source can constantly provide a fixed, predetermined voltage even when the hybrid regulator is off. For example, in the particular implementation of the hybrid regulator in FIG. 6, the output $V_{OUT}$ 304 can ramp up from 0V to a stable output voltage while the input $V_{IN}$ 308 is fixed at a predetermined input voltage. In this situation, as the output $V_{OUT}$ 304 ramps up from 0V, so are the voltages at $V_{N:M\_TOP}$ 620 and $V_{N:M\_BOTTOM}$ 622. This causes a big voltage differential across the inductor 608, which can cause a large current $I_L$ 312 through the inductor until $V_{N:M\_TOP}$ 620 rises above $V_{IN}$ 308. This large current $I_L$ 312 is often referred to as an inrush current. This big, sudden current draw can damage the inductor 608 and/or other components in the hybrid regulator.

Figure 28:
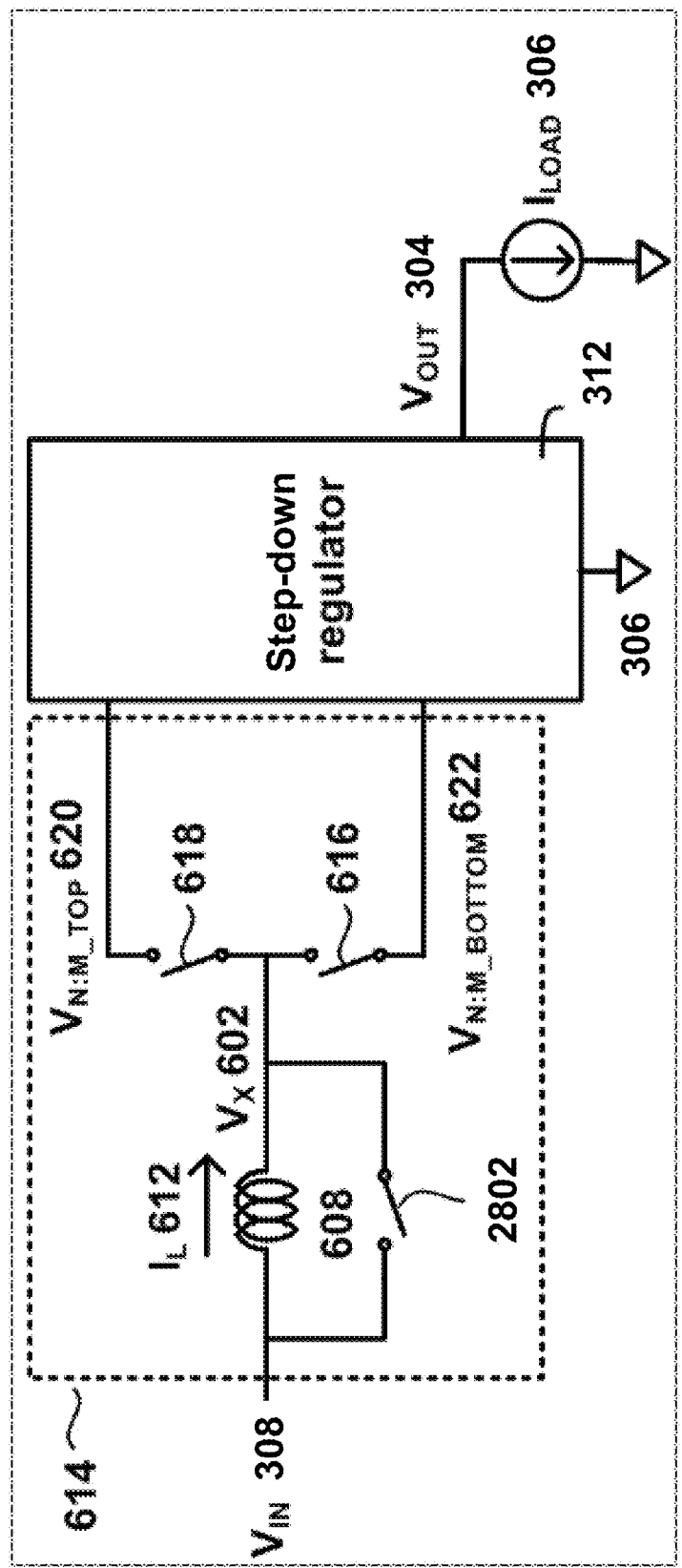
FIG. 28 illustrates a hybrid regulator having a flying switched-inductor regulator with a shunt switch in accordance with some embodiments.

In some embodiments, a flying switched-inductor regulator in a hybrid regulator can include a shunt switch. FIG. 28 illustrates a hybrid regulator having a flying switched-inductor regulator with a shunt switch in accordance with some embodiments. FIG. 28 includes a hybrid regulator of FIG. 6, and also a shunt switch 2802. The shunt transistor 2802 can provide a soft startup mechanism for the inductor 608 and suppress inrush current in the inductor 608 during start-up. Each node of the shunt switch 2802 can be coupled different node of the inductor 608, thereby coupling the input voltage $V_{IN}$ 308 and the intermediate node $V_X$ 602. During start-up, the shunt switch 630 is turned on, thereby shorting the two terminals of the inductor 608. This can ensure that no current is built up in inductor 608 during start-up and that the intermediate node $V_X$ 602 is at the same potential as the input voltage $V_{IN}$ 308. During the start-up process, while the shunt switch 630 is on, one or more of the switches 616, 618 can be turned on and off so that the input voltage $V_{IN}$ 308 can charge up $V_{N:M\_TOP}$ 620 and/or $V_{N:M\_BOTTOM}$ 622 via the switches 616, 618. In some embodiments, the one or more of the switches 616, 618 can be turned on and off in accordance with a predetermined programmable duty cycle so that $V_{N:M\_TOP}$ 620 and/or $V_{N:M\_BOTTOM}$ 622 can ramp up slowly. In some embodiments, the predetermined duty cycle of the switches 616, 618 can be increased over time from zero to a particular value to slowly raise $V_{N:M\_TOP}$ 620 and $V_{N:M\_BOTTOM}$ 622 and thus $V_{OUT}$ 304. These features can enable a smooth start-up of the hybrid regulator.

Figure 29:
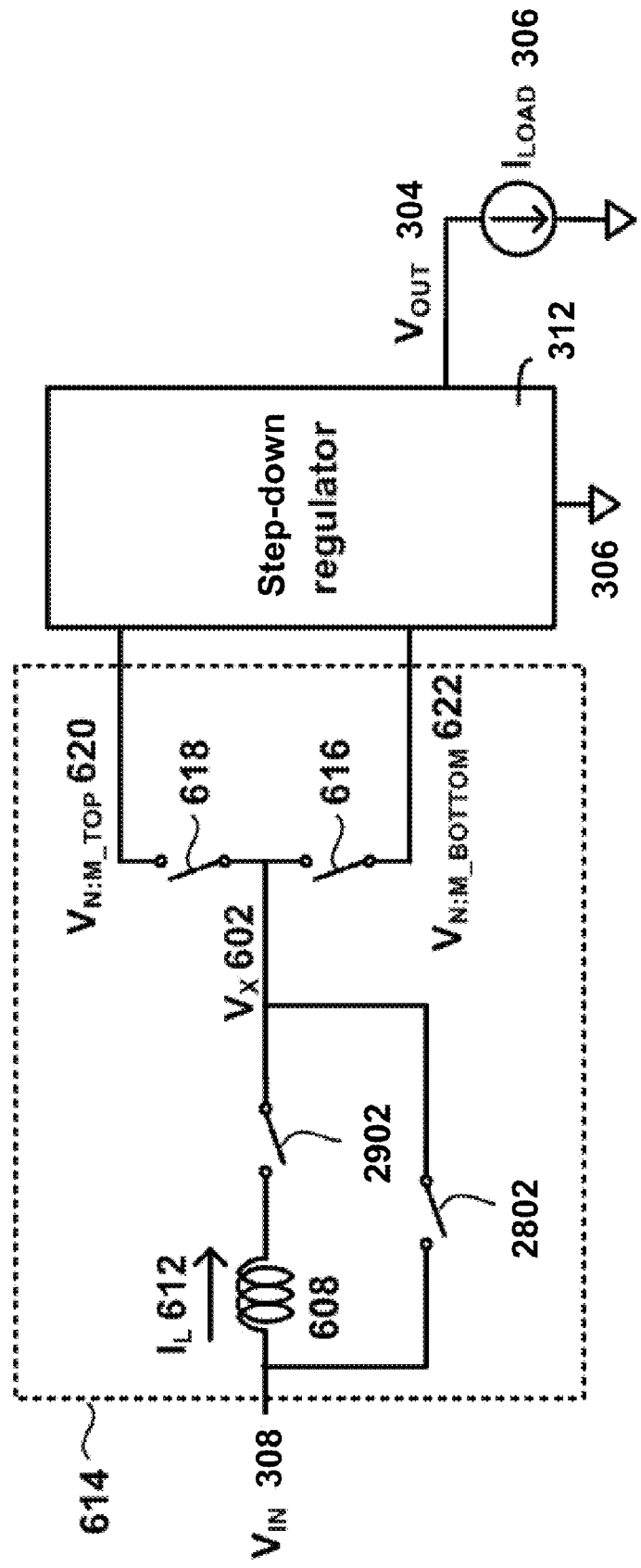
FIG. 29 illustrates a hybrid regulator having a flying switched-inductor regulator with a series switch and a shunt switch in accordance with some embodiments.

In some embodiments, the inductor-switched regulator can include a series switch and a shunt switch. FIG. 29 illustrates a hybrid regulator having a flying switched-inductor regulator with a series switch and a shunt switch in accordance with some embodiments. FIG. 29 includes a hybrid regulator of FIG. 6, and also a series switch 2902 and a shunt switch 2802. During start-up, the series switch 2902 is turned OFF in order to isolate the inductor 608 from the start-up operation. This can ensure that the current $I_L$ 612 through the inductor stays at zero until the start-up process is completed.

Because the current $I_L$ 612 is zero during the start-up process, $V_{N:M\_TOP}$ 620 and $V_{N:M\_BOTTOM}$ 622 can be slowly charged up in at least two methods. In the first method, the shunt switch 2802 can be turned on the entire period of the start-up process, and charge up $V_{N:M\_TOP}$ 620 and $V_{N:M\_BOTTOM}$ 622 as illustrated with respect to FIG. 28. In the second method, one of more of the power switches 616, 618 can be always on while the shunt switch 2802 can be turned on and off with a programmable duty cycle to slowly bring up $V_{N:M\_TOP}$ 620 and $V_{N:M\_BOTTOM}$ 622 and thus $V_{OUT}$ 304.

Figure 30:
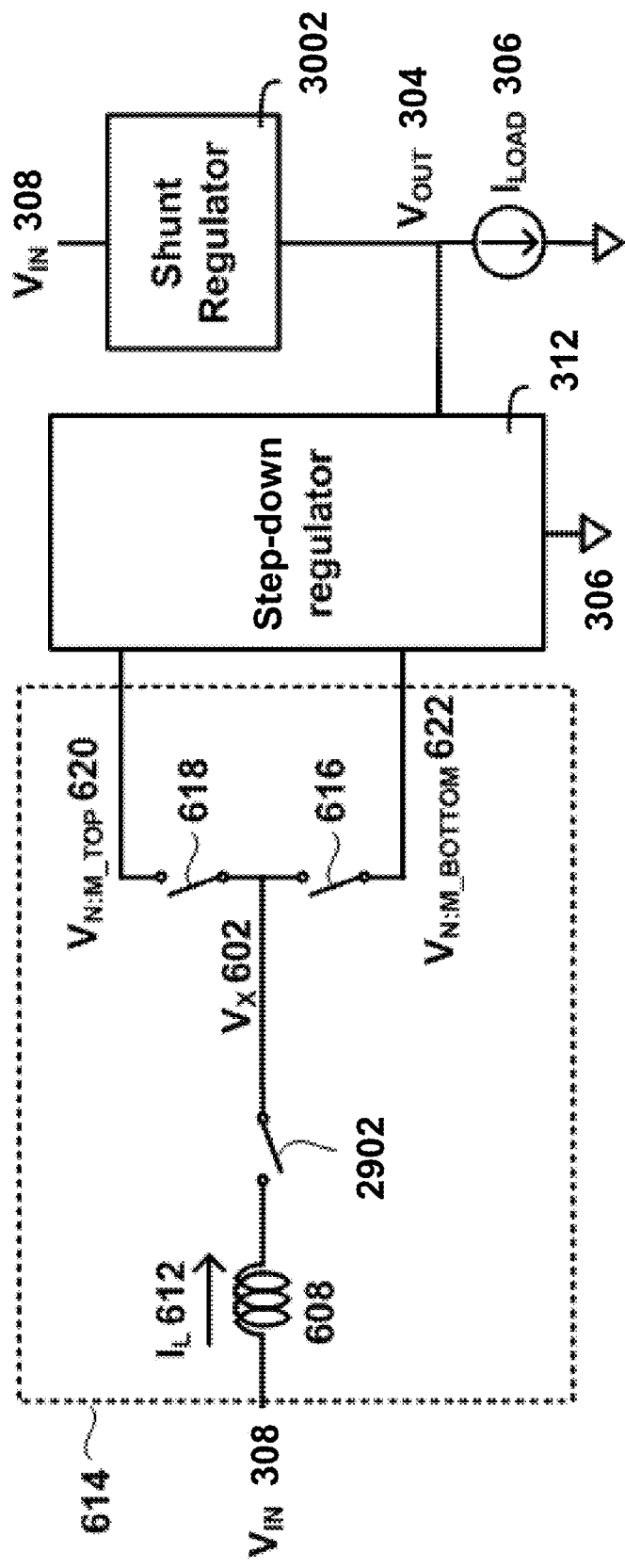
FIG. 30 illustrates a hybrid regulator having a shunt regulator as a start-up circuitry in accordance with some embodiments.

In some embodiments, a hybrid regulator can include a soft start-up circuitry that, in turn, includes using a shunt regulator. FIG. 30 illustrates a hybrid regulator having a shunt regulator as a start-up circuitry in accordance with some embodiments. A soft start-up can be implemented using switch 2902 and the shunt regulator 3002 coupling $V_{IN}$ 308 and $V_{OUT}$ 304. During start-up, the switch 2902 can be turned off to isolate the inductor 608 from the start-up operation. Thus, the switch 2902 can ensure that the current $I_L$ 612 through the inductor 608 can stay at zero until the start-up process is completed. During the start-up process, the shunt regulator 634 can increase $V_{OUT}$ 304. The step-down regulator 312 can operate in a reverse power transfer from $V_{OUT}$ 304 powered by the shunt regulator 3002 to increase $V_{N:M\_TOP}$ 620 and $V_{N:M\_BOTTOM}$ 622 close to $V_{IN}$ 308. At the end of the start-up process, the series switch 2902 is turned on while the power switch 616 and 618 are duty cycled to operate as a flying switched-inductor converter described with respect to FIG. 6. In some embodiments, the shunt regulator can be coupled to any internal nodes of the step-down regulator. The shunt regulator can be turned off during a regular operation of the hybrid regulator. The shunt regulator can include a linear regulator, a switched-capacitor regulator, a buck regulator, or another hybrid regulator.

The terms "a" or "an," as used herein throughout the present application, can be defined as one or more than one. Also, the use of introductory phrases such as "at least one" and "one or more" should not be construed to imply that the introduction of another element by the indefinite articles "a" or "an" limits the corresponding element to only one such element. The same holds true for the use of definite articles.

It is to be understood that the disclosed subject matter is not limited in its application to the details of construction and to the arrangements of the components set forth in the following description or illustrated in the drawings. The disclosed subject matter is capable of other embodiments and of being practiced and carried out in various ways. Also, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, systems, methods and media for carrying out the several purposes of the disclosed subject matter. It is important, therefore, that the claims be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter, which is limited only by the claims which follow.

We claim:
1. A voltage regulator configured to receive a first voltage signal and provide a final voltage signal based, at least in part, on the first voltage signal, the voltage regulator comprising:
   a flying switched-inductor regulator having a first input terminal configured to receive a first voltage signal, a second input terminal configured to receive a second voltage signal, and an output terminal configured to provide an intermediate voltage signal based, at least in part, on the first voltage signal and the second voltage signal;
   a step-down regulator comprising an input terminal, coupled to the output terminal of the flying switched-inductor regulator, an output terminal, and a plurality of capacitors, wherein the step-down regulator is configured to receive, at the input terminal of the step-down regulator, the intermediate voltage signal from the output terminal of the flying switched-inductor regulator and provide, to the output terminal of the step-down regulator, the final voltage signal using a predetermined configuration of the plurality of capacitors; and
   a level shifting regulator comprising an input terminal, an output terminal, a flying capacitor, and a plurality of switches, wherein the level shifting regulator is configured to receive, at the input terminal of the level shifting regulator, the final voltage signal of the step-down regulator and to provide, at the output terminal of the level shifting regulator, the second voltage signal that is based on the final voltage signal of the step-down regulator.

2. The voltage regulator of claim 1, wherein the level shifting regulator is configured to change a configuration of the plurality of switches to provide the flying capacitor in parallel with the first input terminal and the second input terminal of the flying switched-inductor regulator.

3. The voltage regulator of claim 1, wherein the level shifting regulator is configured to change a configuration of the plurality of switches to provide the flying capacitor in parallel with the output terminal of the step-down regulator and ground.

4. The voltage regulator of claim 1, wherein the flying switched-inductor regulator comprises an inductor having an inductance within a range of 100 pico-Henry and 1 micro-Henry.

5. The voltage regulator of claim 1, wherein at least one of the plurality of capacitors in the step-down regulator is fabricated using a dynamic random access memory (DRAM) fabrication process.

6. The voltage regulator of claim 1, wherein the flying switched-inductor regulator comprises a plurality of regulators configured to operate in parallel in a time interleaved manner.

7. The voltage regulator of claim 1, wherein the flying switched-inductor regulator is configured to operate at a first switching frequency, and wherein the step-down regulator is configured to operate at a second switching frequency.

8. The voltage regulator of claim 1, further comprising a first control loop configured to regulate the final voltage signal of the step-down regulator, and a second control loop configured to regulate the intermediate voltage signal of the flying switched-inductor regulator.

9. The voltage regulator of claim 8, wherein the first control loop is configured to operate the step-down regulator to provide a fraction of the intermediate voltage signal at the output node so that the step-down regulator operates in a configuration providing a high conversion efficiency.

10. The voltage regulator of claim 8, wherein the first control loop is configured to operate the step-down regulator to cause the final voltage signal of the step-down regulator to be within a predetermined error range of a target output voltage.

11. The voltage regulator of claim 4, wherein the flying switched-inductor regulator and the step-down regulator, excluding the inductor of the flying switched-inductor regulator, are provided in a single die.

12. The voltage regulator of claim 11, wherein the inductor is provided as a discrete component on-package or on-board.

13. An electronic system comprising:
   a voltage regulator according to claim 1; and
   a target load system coupled to the voltage regulator, wherein the output terminal of the step-down regulator in the voltage regulator is coupled to the target load system.

14. The electronic system of claim 13, wherein the target load system includes a battery and the voltage regulator is configured to receive the first voltage signal from a power line of a Universal Serial Bus and to provide the final voltage signal to the battery.

15. The electronic system of claim 13, wherein the target load system comprises a System on Chip (SoC), and the SoC and the voltage regulator are packaged in a single SoC package.

16. The electronic system of claim 13, wherein the target load system comprises a System on Chip (SoC), and the SoC and the voltage regulator are provided on a printed circuit board (PCB).

17. An electronic system comprising:
   a voltage regulator according to claim 1, wherein the voltage regulator is configured to operate in a reverse direction in which the output terminal of the step-down regulator in the voltage regulator is coupled to an input voltage source and the first input terminal of the flying switched-inductor regulator is coupled to a target load of the voltage regulator.

18. The electronic system of claim 17, wherein the electronic system operating the voltage regulator in a reverse direction is configured to operate the voltage regulator as a step-up regulator.

19. The electronic system of claim 18, wherein the output terminal of the step-down regulator is coupled to a battery and the first input terminal of the flying switched-inductor regulator is coupled to a power line of a Universal Serial Bus.

20. A method of converting an first voltage signal to a final voltage signal using a voltage regulator comprising a flying switched-inductor regulator and a step-down regulator, the method comprising:
   receiving the first voltage signal at a first input terminal of the flying switched-inductor regulator and a second voltage signal at a second input terminal of the flying switched-inductor regulator;
   providing, at an output terminal of the flying switched-inductor regulator, an intermediate voltage signal based, at least in part, on the first voltage signal and the second voltage signal;
   providing, to an output terminal of a step-down regulator using a predetermined configuration of a plurality of capacitors in the step-down regulator, the final voltage signal based on the intermediate voltage signal; and
   receiving, at an input terminal of a level shifting regulator, the final voltage signal and providing, using the level shift regulator, to the second input terminal of the flying switched-inductor regulator, the second voltage signal determined based on the final voltage signal, forming a feedback path between the output terminal of the step-down regulator and the second input terminal of the flying switched-inductor regulator.

21. The method of claim 20, wherein the level shifting regulator comprises a flying capacitor and a plurality of switches, and the method comprises providing the flying capacitor in parallel with the first input terminal and the second input terminal of the flying switched-inductor regulator by modifying a configuration of the plurality of switches.

22. The method of claim 20, wherein the level shifting regulator comprises a flying capacitor and a plurality of switches, and the method further comprises providing the flying capacitor in parallel with the output terminal of the step-down regulator and ground by modifying a configuration of the plurality of switches.

* * * * *